US012791583B2

(12) United States Patent
Lin et al.

(10) Patent No.: US 12,791,583 B2
(45) Date of Patent: Nov. 10, 2026

(54) PROBE SEAT HAVING SUPPORTING STRUCTURE, PROBE HEAD, PROBE CARD AND PROBE SYSTEM

(71) Applicant: MPI CORPORATION, Chu-Pei City (TW)

(72) Inventors: Sheng-Yu Lin, Chu-Pei City (TW); Che-Wei Lin, Chu-Pei City (TW); Hsueh-Chih Wu, Chu-Pei City (TW); Shang-Jung Hsieh, Chu-Pei City (TW)

(73) Assignee: MPI CORPORATION, Chu-Pei City (TW)

( * ) Notice: Subject to any disclaimer, the term of this patent is extended or adjusted under 35 U.S.C. 154(b) by 151 days.

(21) Appl. No.: 18/794,827

(22) Filed: Aug. 5, 2024

(65) Prior Publication Data

US 2025/0314677 A1 Oct. 9, 2025

(30) Foreign Application Priority Data

Apr. 9, 2024 (TW) ................................ 113113139

(51) Int. Cl.
*G01R 1/073* (2006.01)
*G01R 1/02* (2006.01)
(Continued)

(52) U.S. Cl.
CPC ................................ *G01R 1/07342* (2013.01)

(58) Field of Classification Search
CPC . G01R 1/02; G01R 1/04; G01R 1/067; G01R 1/073; G01R 31/00; G01R 31/02; G01R 31/26; G01R 31/28
See application file for complete search history.

(56) References Cited

U.S. PATENT DOCUMENTS 8,933,719 B2 * 1/2015 Huang ............... G01R 1/07342 73/866.5
10,877,085 B2 * 12/2020 Kanai .................... G01R 31/28
(Continued)

FOREIGN PATENT DOCUMENTS

CN 110268274 A 9/2019
CN 213689881 U 7/2021
(Continued)

*Primary Examiner* — Neel D Shah
(74) *Attorney, Agent, or Firm* — Birch, Stewart, Kolasch & Birch, LLP

(57) ABSTRACT

A probe seat includes upper and lower die units, and a supporting structure including supporting pillars disposed between the upper and lower die units. The upper die unit includes upper through holes penetrating through upper and lower surfaces thereof. The lower die unit includes lower through holes penetrating through upper and lower surfaces thereof. An accommodating space is formed around the supporting pillars and between the upper and lower die units for probes to be inserted through the respective upper through holes, the accommodating space, and the respective lower through holes. The supporting pillars include upper supporting pillars protruding out of the lower surface of the upper die unit, and lower supporting pillars protruding out of the upper surface of the lower die unit and in contact with the upper supporting pillars respectively. As such, the probe seat has great structural strength, thereby uneasily deformed.

20 Claims, 18 Drawing Sheets

(51) Int. Cl.

| | |
|---|---|
| ***G01R 1/04*** | (2006.01) |
| ***G01R 1/067*** | (2006.01) |
| ***G01R 31/02*** | (2006.01) |
| ***G01R 31/26*** | (2020.01) |
| ***G01R 31/28*** | (2006.01) |

(56) References Cited

U.S. PATENT DOCUMENTS

| | | | | |
|---|---|---|---|---|
| 2009/0284273 | A1 | 11/2009 | Hasegawa | |
| 2020/0225266 | A1* | 7/2020 | Lou | G01R 31/2891 |
| 2021/0048452 | A1* | 2/2021 | Yang | G01R 1/06722 |

FOREIGN PATENT DOCUMENTS

| | | | |
|---|---|---|---|
| JP | WO2008/114464 | A1 | 9/2008 |
| TW | 200937015 | A | 2/2008 |
| TW | 201109668 | A1 | 3/2011 |
| TW | 201428110 | A | 7/2014 |
| TW | 201634929 | A | 10/2016 |
| TW | 201702611 | A | 1/2017 |

* cited by examiner

PROBE SEAT HAVING SUPPORTING STRUCTURE, PROBE HEAD, PROBE CARD AND PROBE SYSTEM

BACKGROUND OF THE INVENTION

1. Field of the Invention

The present invention relates generally to probe seats of probe cards and more particularly, to a probe seat having a supporting structure, and a probe head, a probe card and a probe system, which include the aforementioned probe seat.

2. Description of the Related Art

The generally called vertical probe head basically includes a plurality of probes held by at least one pair of flat plates or flat-plate-shaped guiding members (or called dies) virtually parallel to each other. Those guiding members have specific holes, and arranged with a specific distance therebetween to reserve a free space or air gap (referred to as accommodating space hereinafter) for movement and possible deformation of probes. This pair of guiding members particularly include an upper guiding member and a lower guiding member, which both have their respective guiding holes. The probes pass through the guiding holes in an axially sliding manner. The probes are usually made of special alloy thin wires having great electrical and mechanical properties. The great connection between the probes and contact pads of an element under test is ensured by the probe head being pressed on the element. During the pressurized contact, the probes slidably placed in the guiding holes of the upper and lower guiding members are curved in the air gap between the two guiding members, and slide in these guiding holes. Besides, an appropriate arrangement may be provided to the probes themselves (meaning that the probes may have a pre-deformation arrangement, commonly known as Cobra probes) or the guiding members for them, for helping the probes to be curved in the air gap, as schematically illustrated in FIG. 15. For the simplification of the illustration, only some of probes in a big number of probes which a probe head usually includes are illustrated in FIG. 15, and the probe head depicted in FIG. 15 is a so-called offset flat plate type.

As shown in FIG. 15, the conventional probe card 10 primarily includes a main circuit board 11, and a probe head 13 directly connected with the main circuit board 11 or indirectly connected with the main circuit board 11 through a space transformer 12. Wherein, the probe head 13 schematically illustrated in FIG. 15 particularly includes at least one upper flat plate or guiding member (referred to as upper die 14 hereinafter), and at least one lower flat plate or guiding member (referred to as lower die 15 hereinafter). They have upper guiding holes 142 and lower guiding holes 152 respectively, and at least one probe 16 slides therein. Alternatively, the probe head 13 further includes a middle flat plate or guiding member (referred to as middle die 17 hereinafter). The probe 16 has at least one contact end portion or tip portion (referred to as contact tip portion 162 hereinafter). The term 'end portion' or 'tip portion' mentioned here and hereinafter means a terminal part, which is unlimited to be sharp-pointed. In particular, the contact tip portion 162 is abutted on a contact pad 182 of an element under test (referred to as device under test or DUT 18 hereinafter), causing electrical and mechanical contact between the DUT 18 and a test device (not shown). The probe head 13 is formed as a terminal member thereof. A large-area probe card is configured primarily for testing a plurality of DUTs 18 at the same time, so as to enhance the testing efficiency and lower the testing cost. Therefore, the large-area probe card needs a large-area probe seat, which includes upper and lower dies 14 and 15 or upper, middle and lower dies 14, 15 and 17, for being inserted with a large number of probes 16 corresponding to a plurality of DUTs 18.

However, no matter the probe seat is composed of upper and lower dies 14 and 15 or upper, middle and lower dies 14, 15 and 17, a central section of the probe seat, i.e. the section for the arrangement of the probes 16, has an accommodating space 19 located between the upper and lower dies 14 and 15. The accommodating space 19 may be formed by a hollow middle die 17, as shown in FIG. 15. Alternatively, in the condition without the middle die, the accommodating space may be formed by the combination of a recess located at the bottom of the upper die and another recess located at the top of the lower die. The accommodating space 19 is arranged to accommodate body portions 164 of all probes 16, thereby allowing deformation of the probes 16 and ensuring the contact tip portions 162 and head portions 166 of the probes 16 to be in contact with contact pads of the DUT 18 and the space transformer 12 respectively. Therefore, the large-area probe seat should have a large-area accommodating space 19. In other words, there is a very long span between the portions of the upper and lower dies 14 and 15 supporting each other on two sides thereof, or the portions of the upper and lower dies 14 and 15 located on two sides thereof and supported by the middle die 17, resulting in that the central section of the probe seat may have a poor structural strength. Therefore, the upper and lower dies 14 and 15 are liable to be deformed by an external force, no matter the external force is an inward pushing force or an outward pulling force.

SUMMARY OF THE INVENTION

The present invention has been accomplished in view of the above-noted circumstances. It is a primary objective of the present invention to provide a probe seat having a supporting structure, which has great structural strength and thereby uneasy to be deformed.

To attain the above objective, the present invention provides a probe seat which includes two die units, a supporting structure, and an accommodating space. The two die units include an upper die unit, and a lower die unit. The upper die unit includes an upper surface, a lower surface, and a plurality of upper through holes penetrating through the upper surface and the lower surface of the upper die unit. The lower die unit includes an upper surface, a lower surface, and a plurality of lower through holes penetrating through the upper surface and the lower surface of the lower die unit. The supporting structure includes a plurality of supporting pillars. The plurality of supporting pillars are disposed between the upper die unit and the lower die unit. The accommodating space is formed around the plurality of supporting pillars and between the upper die unit and the lower die unit. The accommodating space is adapted for a plurality of probes to be inserted through the upper through holes, the accommodating space, and the lower through holes, respectively. The plurality of supporting pillars include a plurality of upper supporting pillars, and a plurality of lower supporting pillars. The upper supporting pillars protrude out of the lower surface of the upper die unit. The lower supporting pillars protrude out of the upper surface of the lower die unit. The upper supporting pillars are in contact with the lower supporting pillars, respectively.

As a result, the probe seat provided by the present invention may have a middle die and the accommodating space for accommodating the probes is formed in the middle die. Alternatively, the probe seat may have no middle die, and the accommodating space for accommodating the probes is formed by the combination of the upper and lower die units directly connected with each other. In the accommodating space, the place where no probe is disposed can be arranged with the upper and lower supporting pillars. The upper and lower supporting pillars protrude from the upper and lower die units respectively, and are in contact with each other. Such upper and lower supporting pillars enhance the structural strength of the upper and lower die units respectively. In addition, when the upper and lower die units are connected with each other, the upper and lower supporting pillars further collectively strengthen the part of the central section of the probe seat with the accommodating space and the resulting lower structural strength. Therefore, the probe seat, even in the large-area condition, may still have a great structural strength and thereby is uneasy to be deformed, so that the deformation of the lower die unit caused by the reacting force from the device under test (also referred to as DUT hereinafter) will be reduced.

Preferably, the lower surface of the upper die unit and the upper surface of the lower die unit are each defined as a supported surface. At least one or more of the supporting pillars of the supporting structure monolithically extend from the respective supported surface.

As a result, the upper supporting pillars are monolithically connected with the die of the upper die unit. The lower supporting pillars are monolithically connected with the die of the lower die unit. Such structure is simple, beneficial for manufacture and assembly, and further enhances the structural strength of the upper and lower die units themselves.

Preferably, at least one or more of the supporting pillars of the supporting structure are attached to the respective die unit non-monolithically.

As a result, in the condition that it is uneasy to make the monolithically formed supporting pillars and the die by processing or due to other requirements, the supporting pillars may be individual elements, which are not monolithically formed with the die but attached to the die unit by assembling. The probe seat of the present invention may include the monolithic type supporting pillar and the non-monolithic type supporting pillar, which can be arranged according to the requirement.

More preferably, for the upper supporting pillar and the lower supporting pillar in contact with each other, one of them is a rod and the other of them is a bolt. The rod and the bolt are inserted through the two die units respectively. The rod has a threaded hole. The bolt is screwed into the threaded hole of the rod.

As a result, the upper and lower supporting pillars are connected with each other in a directly screwing manner. Such structure is simple, easy in manufacture and assembly, and stable in connection effect, capable of resisting not only the inward pushing external force but also the outward pulling external force, thereby achieving a great effect of preventing the die unit from deformation.

More preferably, the rod includes an extending section protruding out of one of the upper surface of the upper die unit and the lower surface of the lower die unit. The extending section is adapted to be abutted against a reinforcing member.

As a result, the reinforcing member may be another member of the probe card. For example, the reinforcing member may be another member mounted on the space transformer in such a way that the extending section of the rod is adapted to be inserted through the space transformer, and inserted into and engaged with the aforementioned another member. In this way, the structural strength of the probe seat can be further enhanced, and the extending section of the rod may be even fastened to the reinforcing member by another bolt, thereby achieving more stable fastening of the rod.

Preferably, each of the supporting pillars has an end surface. For the upper supporting pillar and the lower supporting pillar in contact with each other, the end surfaces thereof are abutted on each other.

As a result, such upper and lower supporting pillars may have a simple structure that can be easily manufactured and assembled, and the design that the end surfaces of the upper and lower supporting pillars are abutted on each other can provide the probe seat a great push resisting rigidity for resisting the inward pushing external force so as to prevent the die unit from being deformed by the received force.

More preferably, the upper supporting pillar and the lower supporting pillar in contact with each other are further fixed to each other by gluing.

As a result, before the end surfaces of the upper and lower supporting pillars are abutted on each other, glue can be disposed on at least one of the end surfaces, so that when the end surfaces of the upper and lower supporting pillars are abutted on each other, they are fixed to each other by gluing at the same time. Such fixing manner is simple, convenient and firm, capable of further improving the push resisting rigidity and the pull resisting rigidity for resisting the inward pushing external force and the outward pulling external force, so as to prevent the die unit from being deformed by the received force.

More preferably, the upper supporting pillar and the lower supporting pillar in contact with each other are further fastened to each other by a bolt.

As a result, the design that the end surfaces of the upper and lower supporting pillars are abutted on each other can improve the push resisting rigidity for resisting the inward pushing external force. The design that the upper and lower supporting pillars are further fastened to each other by the bolt can improve the pull resisting rigidity for resisting the outward pulling external force. Therefore, the effect of preventing the die unit from deformation is great.

More preferably, the distance between the end surface of the upper supporting pillar and the lower surface of the upper die unit is smaller than the distance between the end surface of the lower supporting pillar and the upper surface of the lower die unit. The bolt is inserted through the upper supporting pillar and screwed into the lower supporting pillar.

As a result, the bolt may be screwingly fastened downwardly. That is, the bolt is firstly inserted through the upper supporting pillar and then screwed into the lower supporting pillar. Such screwingly fastening manner can avoid orienting the head portion of the bolt toward the device under test, which may affect the device under test if the bolt loosens. Besides, the length of the lower supporting pillar is larger than the length of the upper supporting pillar, which enables the lower supporting pillar to be provided with the threaded hole long enough for the bolt to be screwed therein firmly.

More preferably, for the upper supporting pillar and the lower supporting pillar in contact with each other, one of them includes a protrusion located on the end surface and the other of them includes a recess located on the end surface. The protrusion is embedded in the recess.

As a result, the design that the end surfaces of the upper and lower supporting pillars are abutted on each other can improve the push resisting rigidity for resisting the inward pushing external force. The design that the upper and lower supporting pillars are additionally provided with the recess and the protrusion embedded in the recess can further improve the push resisting rigidity and the pull resisting rigidity for resisting the inward pushing external force and the outward pulling external force, so as to prevent the die unit from being deformed by the received force. Before the protrusion is embedded in the recess, glue can be disposed on at least one of the protrusion and the recess, so that when the protrusion is embedded in the recess, they are also fixed to each other by gluing. Such fixing effect is relatively firmer, further improving the push resisting rigidity and the pull resisting rigidity. Besides, the recess and the protrusion also facilitate alignment and/or positioning during the assembly.

Preferably, the lower surface of the upper die unit and the upper surface of the lower die unit are each defined as a supported surface. The plurality of supporting pillars further include at least one individual supporting pillar. The individual supporting pillar is inserted through one of the upper die unit and the lower die unit, and abutted on the supported surface of the other of the upper die unit and the lower die unit.

As a result, the part of the central section of the probe seat with the accommodating space and the resulting lower structural strength not only can be strengthened by the upper and lower supporting pillars collectively, but also can be further strengthened by the additional individual supporting pillar which can be especially disposed at the portion the supporting pillar integrated with the die is uneasy to be made by processing or the portion the bolt for fastening is unable to be disposed, so that the portion can be also structurally strengthened.

More preferably, the individual supporting pillar includes an extending section protruding out of one of the upper surface of the upper die unit and the lower surface of the lower die unit. The extending section is adapted to be abutted against a reinforcing member.

As a result, the reinforcing member may be another member of the probe card. For example, the reinforcing member may be another member mounted on the space transformer in such a way that the extending section of the individual supporting pillar is adapted to be inserted through the space transformer, and inserted into and engaged with the aforementioned another member. In this way, the structural strength of the probe seat can be further enhanced, and the extending section of the individual supporting pillar may be even fastened to the reinforcing member by a bolt, thereby achieving more stable fastening of the individual supporting pillar.

Preferably, the upper die unit includes a connecting surface, and an upper recess recessed from the connecting surface of the upper die unit. The lower surface of the upper die unit is located in the upper recess. The lower die unit includes a connecting surface, and a lower recess recessed from the connecting surface of the lower die unit. The upper surface of the lower die unit is located in the lower recess. The connecting surface of the upper die unit and the connecting surface of the lower die unit are connected with each other. The accommodating space is formed by a combination of the upper recess and the lower recess.

As a result, the probe seat has no middle die, the upper and lower die units are connected with each other directly, and the accommodating space for accommodating the probes is formed by the combination of the upper and lower recesses of the upper and lower die units. In the accommodating space, the place where no probe is disposed can be arranged with the upper and lower supporting pillars, so the upper and lower supporting pillars are located in the upper and lower recesses. Such structure is simple, beneficial for manufacture and assembly, great in structural strength, and can prevent the upper and lower supporting pillars from completely protruding outside to cause collision and damage easily when the assembly of the probe seat is not accomplished.

More preferably, each of the supporting pillars has an end surface. The end surfaces of the upper supporting pillars are flush with the connecting surface of the upper die unit. The end surfaces of the lower supporting pillars are flush with the connecting surface of the lower die unit.

As a result, the structures composed of the upper and lower supporting pillars and the upper and lower die units respectively are simple and have great structural strength. Besides, in the condition that the upper and lower supporting pillars monolithically extend from the surfaces in the upper and lower recesses respectively, the design that the end surfaces of the upper and lower supporting pillars are flush with the connecting surfaces of the upper and lower die units respectively facilitates the manufacture.

Preferably, the lower surface of the upper die unit and the upper surface of the lower die unit are each defined as a supported surface. The supporting structure further includes a plurality of connecting ribs. Each connecting rib is connected to two adjacent supporting pillars and the supported surface on which the two adjacent supporting pillars are located.

As a result, in the space between the supporting pillars, the place where no probe has to be disposed can be arranged with the connecting rib. The connecting rib can enhance the structural strength of the supporting pillars and the die unit connected with the connecting rib, thereby further preventing the probe seat from being deformed by the received force.

Preferably, at least one of the two die units includes two dies. Each die includes a joining surface. The joining surfaces of the two dies are connected with each other. For the joining surfaces of the two dies, one of them includes a plurality of protrusions and the other of them includes a plurality of recesses. The protrusions are embedded in the recesses, respectively.

As a result, the design that the die unit is composed of two dies connected with each other enables the die unit to have a certain thickness to provide a great structural strength even in the large-area condition, and can also avoid a drilling problem caused by too large aspect ratio for drilling a single thick die. Besides, the design that the joining surfaces of the dies have the recesses and the protrusions embedded in the recesses not only improve the connecting effect of the dies but also facilitates alignment.

Preferably, the probe seat includes a plurality of probe zones and a plurality of non-probe zones, which are distributed in a staggered manner. The probe zones and the non-probe zones are collectively arranged in a matrix. The upper through holes and the lower through holes are located in the probe zones. The supporting pillars are located in the non-probe zones.

As a result, such probe seat is adapted for the testing manner of testing the non-adjacent DUTs at the same time, which is usually called skipping DUT. Every two probe zones are provided with a non-probe zone therebetween for the arrangement of the supporting pillars, which can attain great structural strength.

Preferably, the probe seat includes a plurality of non-probe zones and a probe zone. The non-probe zones are arranged in a matrix. The probe zone is distributed in a grid pattern on the periphery of the plurality of non-probe zones and between the non-probe zones. The upper through holes and the lower through holes are located in the probe zone. The supporting pillars are located in the non-probe zones.

As a result, the probes can be distributed in a grid pattern to form the plurality of non-probe zones surrounded by the probes, which can make the supporting pillars distributed relatively evener to attain great structural strength.

The present invention further provides a probe head for performing a functional test to a device under test. The probe head includes a probe seat as described above, and a plurality of probes inserted through the probe seat.

As a result, the probe head, which uses the above-described probe seat having the supporting structure provided by the present invention, may have a great structural strength and be uneasy to be deformed even in the large-area condition.

The present invention further provides a probe card for performing a functional test to a device under test. The probe card includes an interface board, a space transformer, and a probe seat as described above. The interface board is arranged to interface with a test apparatus. The space transformer is associated with the interface board and adapted for providing space transformation in interval between contact pads formed on two opposite surfaces of the space transformer. The probe head is associated with the space transformer.

As a result, the probe card of the present invention can be a large-area probe card so as to enhance the testing efficiency and lower the testing cost, and the probe head of the probe card, which uses the above-described probe seat having the supporting structure provided by the present invention, may have a great structural strength and be uneasy to be deformed even in the large-area condition.

The present invention further provides a probe system for performing a functional test to a device under test formed on a substrate. The probe system includes a chuck arranged for supporting the substrate, a test apparatus adapted to be electrically connected with the device under test so as to create an electrical property testing process, and a probe card as described above for electrically connecting the device under test with the test apparatus so as to perform the functional test to the device under test.

As a result, the probe card in the probe system can be a large-area probe card so as to enhance the testing efficiency and lower the testing cost, and the probe head of the probe card, which uses the above-described probe seat having the supporting structure provided by the present invention, may have a great structural strength and be uneasy to be deformed even in the large-area condition.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
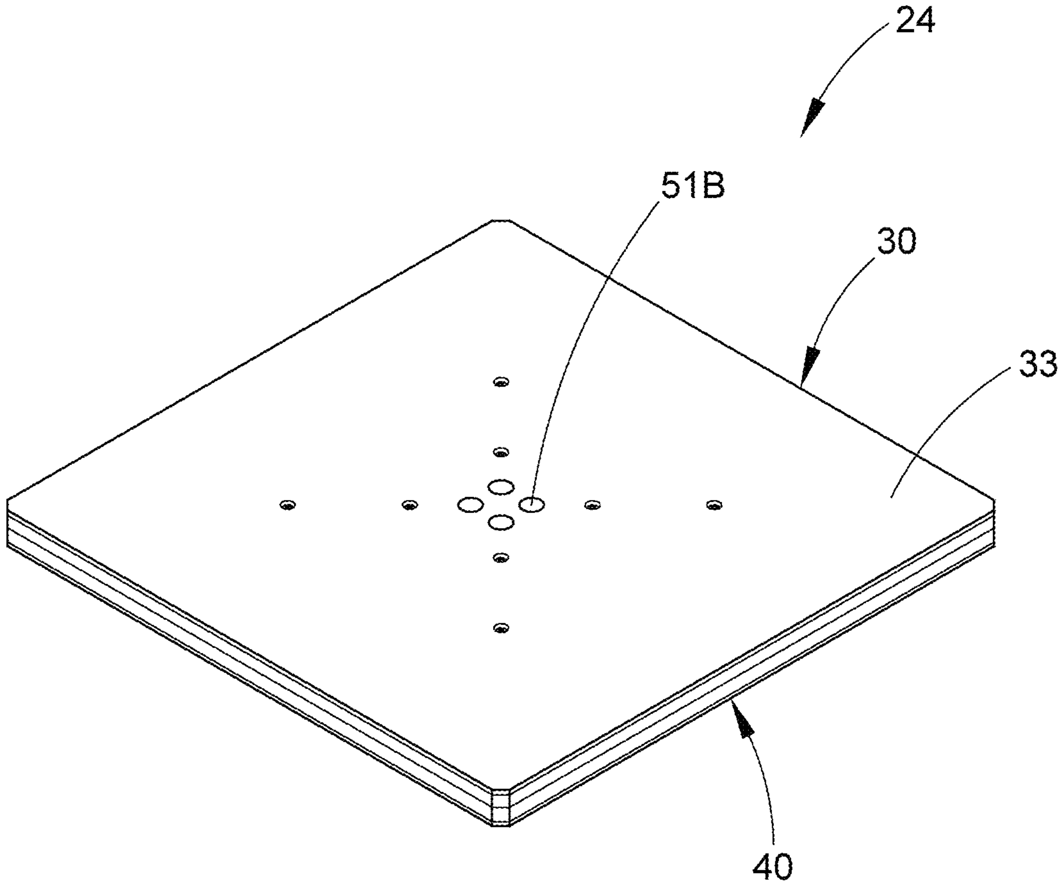
FIG. 1 is an assembled perspective view of a probe seat having a supporting structure according to a preferred embodiment of the present invention.

First of all, it is to be mentioned that same or similar reference numerals used in the following embodiments and the appendix drawings designate same or similar elements or the structural features thereof throughout the specification for the purpose of concise illustration of the present invention. It should be noticed that for the convenience of illustration, the components and the structure shown in the figures are not drawn according to the real scale and amount, and the features mentioned in each embodiment can be applied in the other embodiments if the application is possible in practice. Besides, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between aforesaid former and latter elements.

Referring to FIG. 1 to FIG. 4, FIG. 5*a* and FIG. 5*b*, the practical configuration of a probe seat 24 according to a preferred embodiment of the present invention is shown in FIG. 1 to FIG. 4. For the simplification of figures and the convenience of illustration, the probe seat 24 is also schematically shown in FIG. 5*a* and FIG. 5*b*.

Figure 5A:
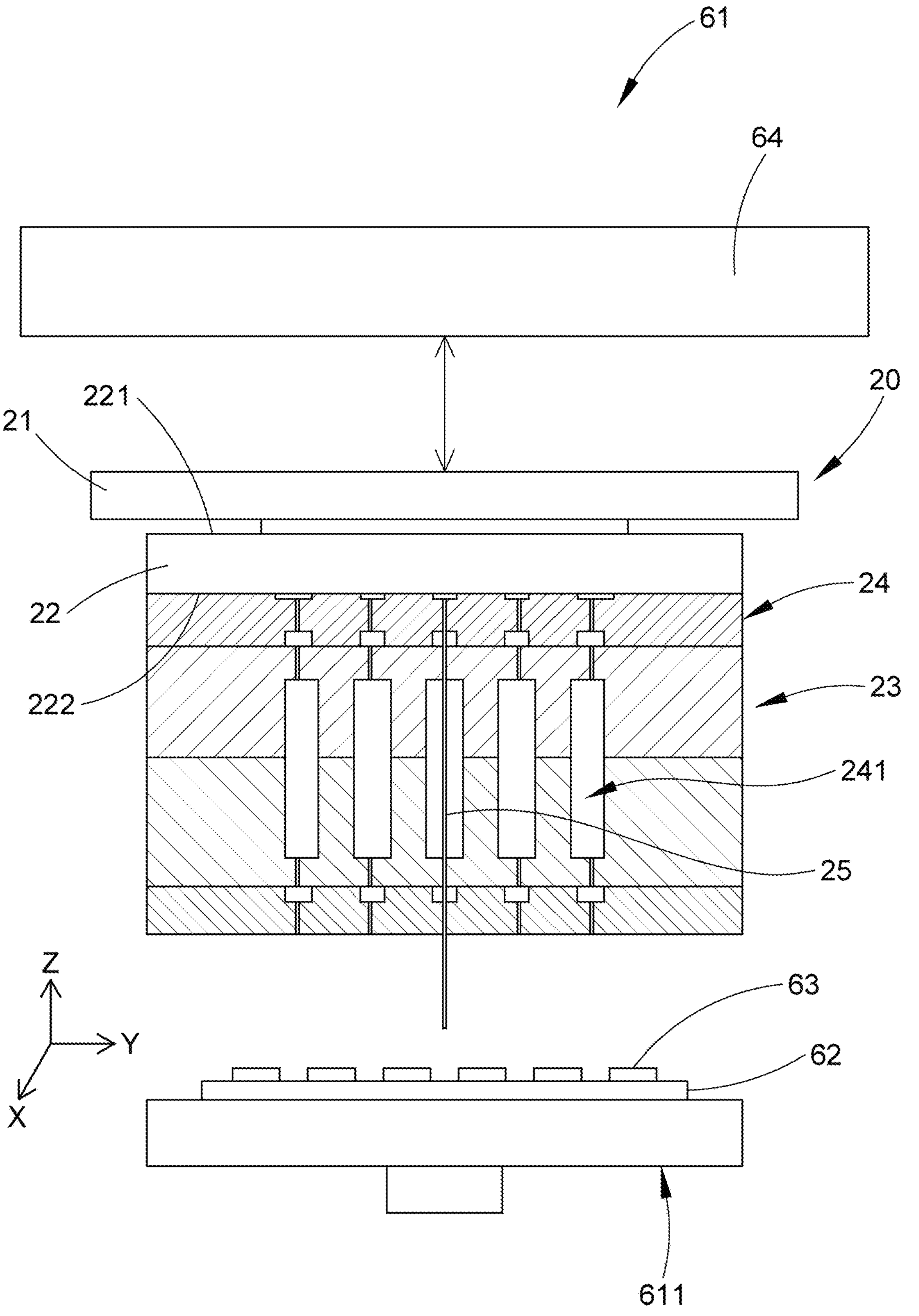
FIG. 5*a* is a schematic sectional view of a probe card using the probe seat of the present invention, a test apparatus, a chuck, a substrate and a plurality of DUTs.
Figure 5B:
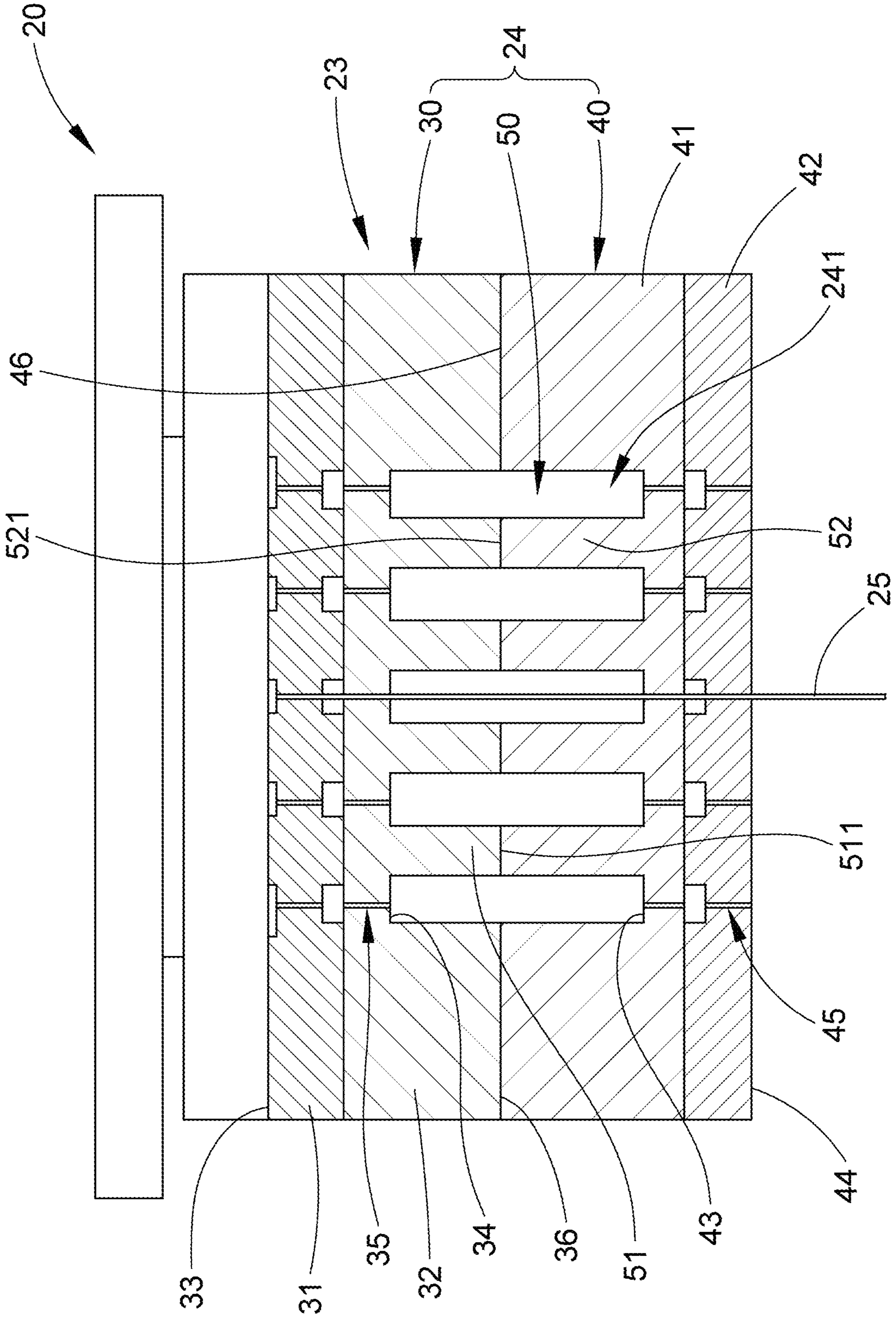
FIG. 5*b* is a schematic sectional view of the probe card shown in FIG. 5*a;*

Specifically speaking, a probe system 61 is shown in FIG. 5*a*. The probe system 61 is adapted for testing a DUT 63 formed on a substrate 62. The probe system 61 includes a chuck 611 arranged for supporting the substrate 62, and a probe card 20. The probe card 20 includes an interface board 21 which is also called main circuit board, a space transformer 22, and a probe head 23. The interface board 21 is arranged to interface with a test apparatus 64. The space transformer 22 is associated with the interface board 21. The probe head 23 is associated with the space transformer 22. The aforementioned term 'associated' refers to a component is connected with another component directly or indirectly, unlimited to be connected in a firm manner. The space transformer 22 is adapted for providing space transformation in interval between contact pads (not shown) formed on two opposite surfaces 221 and 222 of the space transformer, which means the interval between the contact pads formed on the surface 221 for the connection with the interface board 21 is unequal to the interval between the contact pads formed on the surface 222 for the connection with the probe head 23. The probe head 23 includes a probe seat 24, and a plurality of probes 25 inserted through the probe seat 24. For the simplification of figures and the convenience of illustration, only one probe 25 is shown in FIG. 5*a* and FIG. 5*b*. By contacting the probe 25 with the device under test (also referred to as DUT hereinafter), the probe card 20 can make the DUT electrically connected with the test apparatus 64, so as to perform a functional test to the DUT. Further specifically speaking, every probe 25 includes a first end portion, a second end portion and a probe main body located between the first end portion and the second end portion. The first end portion, i.e. the head portion of the probe, is ended at a contact tip and configured to adjoin a contact pad and/or bump of the DUT integrated in a semiconductor wafer. The second end portion, i.e. the tail portion of the probe, is ended at a contact head and configured to adjoin the contact pad of the space transformer 22. The probe main body, i.e. the body portion of the probe, basically extends between the first end portion and the second end portion along a longitudinal axis. The tail portion of every probe 25 is inserted through the upper through hole 35 of the upper die unit 30 for being electrically connected with the space transformer 22. The head portion of every probe 25 is adapted to electrically contact the DUT. The head portion of every probe 25 can be arranged for electrical and/or contact communication with the corresponding contact pad of the DUT. In some examples, communication refers to that it can be arranged to transmit the test signal of the probe card 20 to the DUT and/or receive the composite signal from the DUT. Besides, although the probe 25 is drawn as the straight probe type in FIG. 5*a* and FIG. 5*b*, this is not a direct limitation on the probe type adapted for the present invention. In fact, the probe adapted for the present invention is the vertical probe, at least including the straight probe or the pre-curved probe. The straight probe may be, for example, forming wire (FW), MEMS wire (MW) or pogo pin. The pre-curved probe may be, for example, Cobra probe or forming wire with a pre-curved body portion. The so-called vertical probe head basically includes a plurality of contact probes 25 held by a probe seat 24. The probe seat 24 has specific holes such as guiding holes, vias or through holes, and a free space or air gap (referred to as accommodating space hereinafter) for the movement and possible deformation of the contact probes 25. Besides, an appropriate arrangement may be provided to the probes themselves (such as the pre-curved probe) or the dies for them, for helping the contact probes (such as the forming wire or MEMS wire included in the straight probe) to be curved in the air gap (not shown). For example, the so-called offset flat plate type, which is adapted for the forming wire or MEMS wire included in the straight probe, refers to that the upper die is horizontally displaced relative to the lower die. Wherein, the term 'horizontally displaced' refers to that the centers of the upper guiding holes are offset from the centers of the lower guiding holes respectively, not in the same vertical line along Z-axis indicated in the coordinate system shown in the figures. The Z-axis is perpendicular to a reference plane corresponding to a horizontally extending plane of the dies. Accordingly, the contact probes accommodated in the guiding holes of the upper die and the lower die are deformed with respect to a longitudinal axis thereof corresponding to the Z-axis in the coordinate system shown in the figures. The longitudinal axis is arranged perpendicularly to the reference plane. The upper die and the lower die are parallel to each other, and extend along a reference plane. The semiconductor wafer, the DUT, and the board of the space transformer also extend along the reference plane. If the probes in the vertical probe head are the so-called pre-curved probes, such as the example of the Cobra probes in the conventional probe head, the contact probes have a pre-deformation arrangement, thereby having an offset between the contact tip portion and the contact head, which are already defined in placement condition of the probe head. Especially in this example, the contact probe includes a pre-deformed portion. The pre-deformed portion can help the contact probe to curve appropriately, even when the probe head is not in contact with the element under test. The contact probe is further deformed during the operation thereof, i.e. in the process of being pressurized to contact the element under test. It should be noticed that for the appropriate operation of the probe head, the contact probes should have appropriate freedom of axially moving in the guiding holes. In this way, when a probe malfunctions, it can be extracted and replaced, avoiding the compelling replacement of the entire probe head. The freedom of axially moving, especially for the probes to slide in the guiding holes, is proportional to the normal safety requirement of the probe head during the operation thereof.

As shown in FIG. 1 to FIG. 4 and FIG. 5*b*, the probe seat 24 includes two die units, including an upper die unit 30 and a lower die unit 40, and a supporting structure 50.

In this embodiment, the upper die unit 30 is composed of two dies 31 and 32 piled on one another, and the lower die unit 40 is composed of two dies 41 and 42 piled on one another. However, each die unit may include one or more dies, i.e., at least one die included in each die unit may be sufficient. Some applications may even include only one of the upper die unit 30 and the lower die unit 40.

The upper die unit 30 includes an upper surface 33, a lower surface 34, and a plurality of upper through holes 35 penetrating through the upper surface 33 and the lower surface 34. In this embodiment, each upper through hole 35 has a part located in the die 31 and the other part located in the die 32, and the two parts of the upper through hole 35 are coaxial with each other. The lower die unit 40 includes an upper surface 43, a lower surface 44, and a plurality of lower through holes 45 penetrating through the upper surface 43 and the lower surface 44. In this embodiment, each lower through hole 45 has a part located in the die 41 and the other part located in the die 42, and the two parts of the lower through hole 45 are coaxial with each other. In practice, the upper and lower through holes 35 and 45 of the probe seat

24 are tiny in radius and large in amount. For the simplification of figures and the convenience of illustration, the upper and lower through holes 35 and 45 are not shown in FIG. 1 to FIG. 4, and only a few upper and lower through holes 35 and 45 are schematically shown in FIG. 5*b*.

The supporting structure 50 includes a plurality of supporting pillars. The plurality of supporting pillars include a plurality of upper supporting pillars 51 and a plurality of lower supporting pillars 52, as shown in FIG. 5*b*. The plurality of supporting pillars are disposed between the upper die unit 30 and the lower die unit 40. In the present invention, the lower surface 34 of the upper die unit 30 and the upper surface 43 of the lower die unit 40 refer to the surfaces which the supporting pillars are located on. Therefore, the lower surface 34 of the upper die unit 30 and the upper surface 43 of the lower die unit 40 are each defined as a supported surface.

Figure 2:
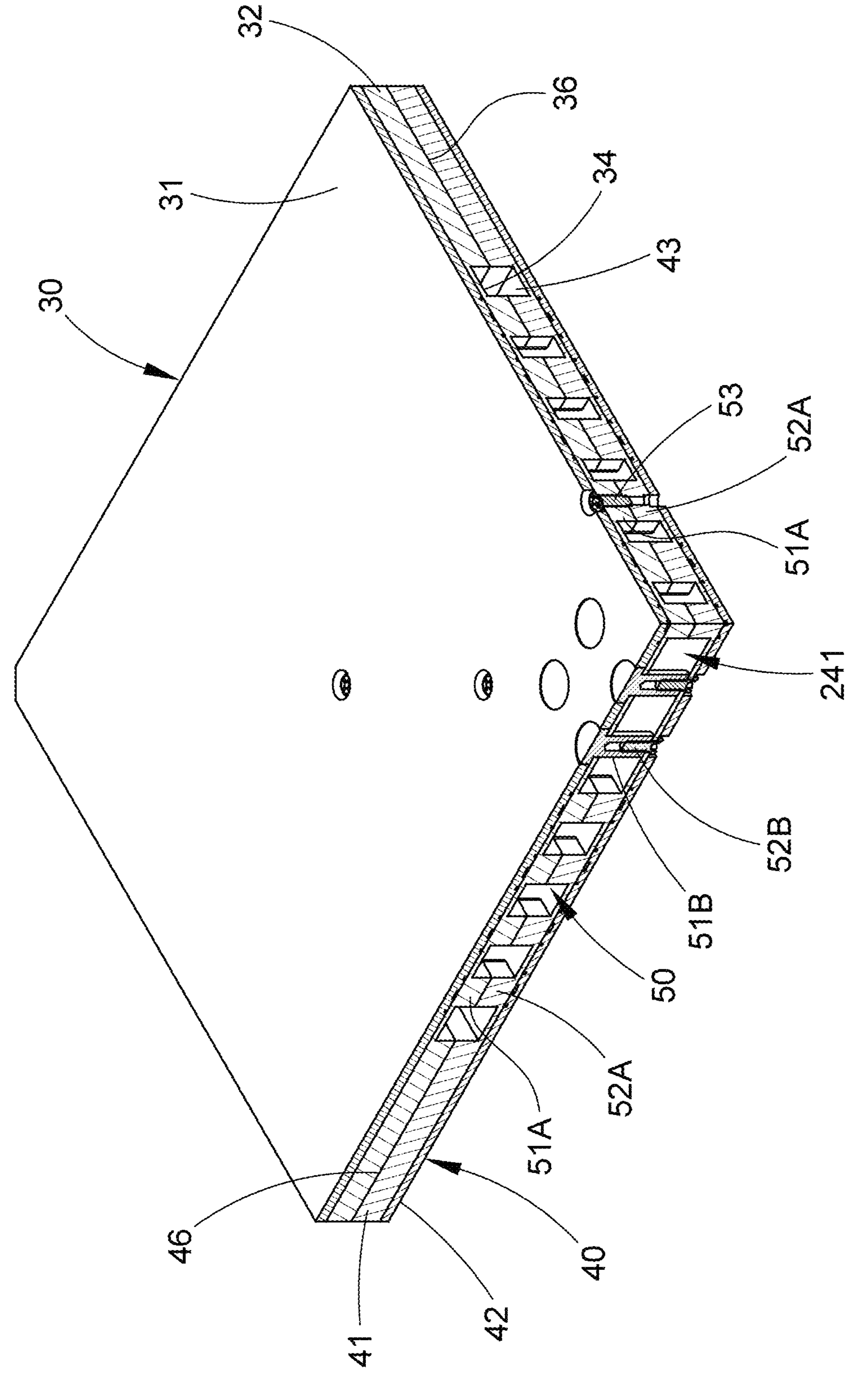
FIG. 2 is a partially cut-off perspective view of the probe seat shown in FIG. 1.
Figure 3:
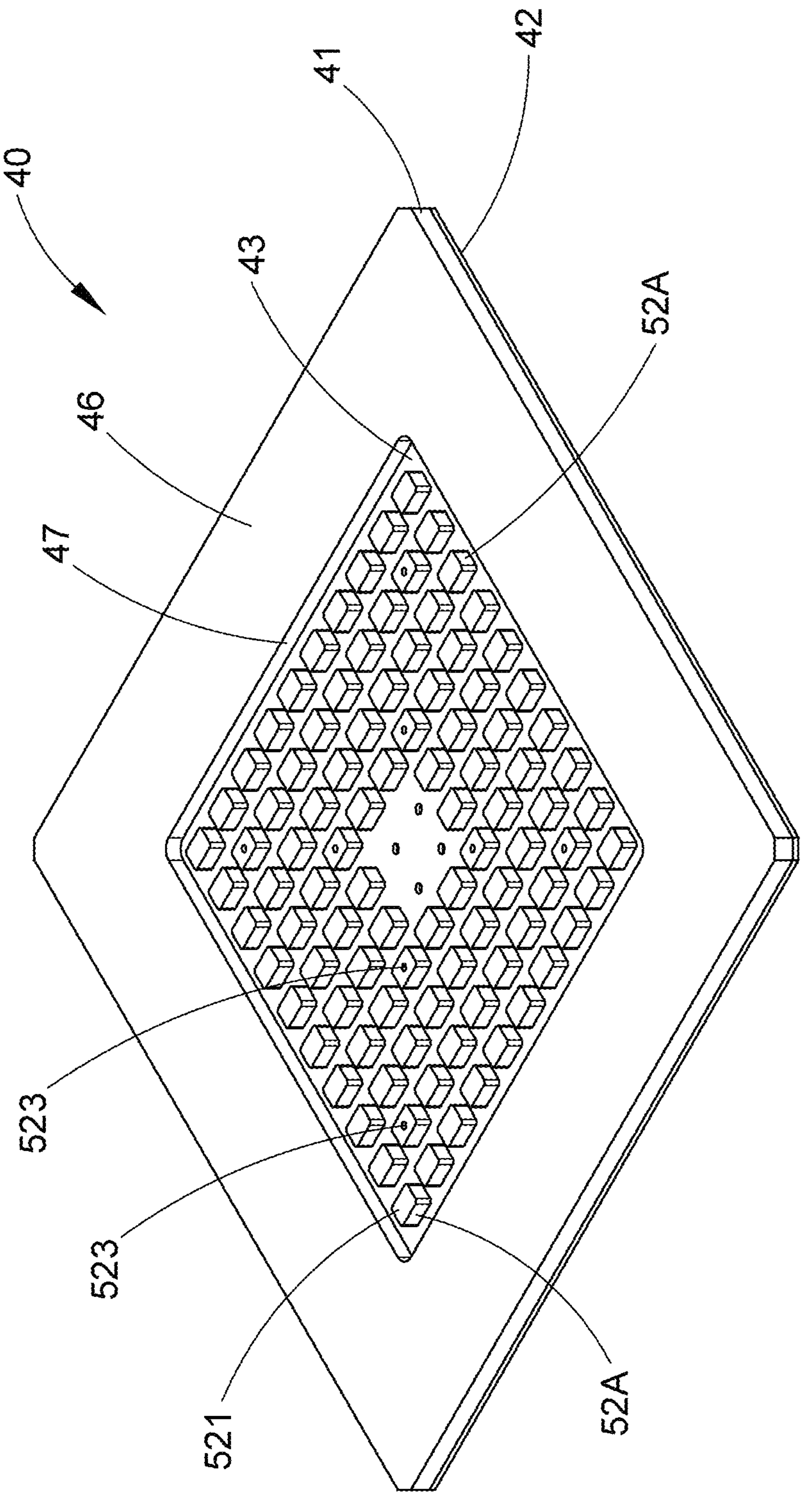
FIG. 3 is an assembled perspective view of a lower die unit and a plurality of lower supporting pillars of the probe seat.
Figure 4:
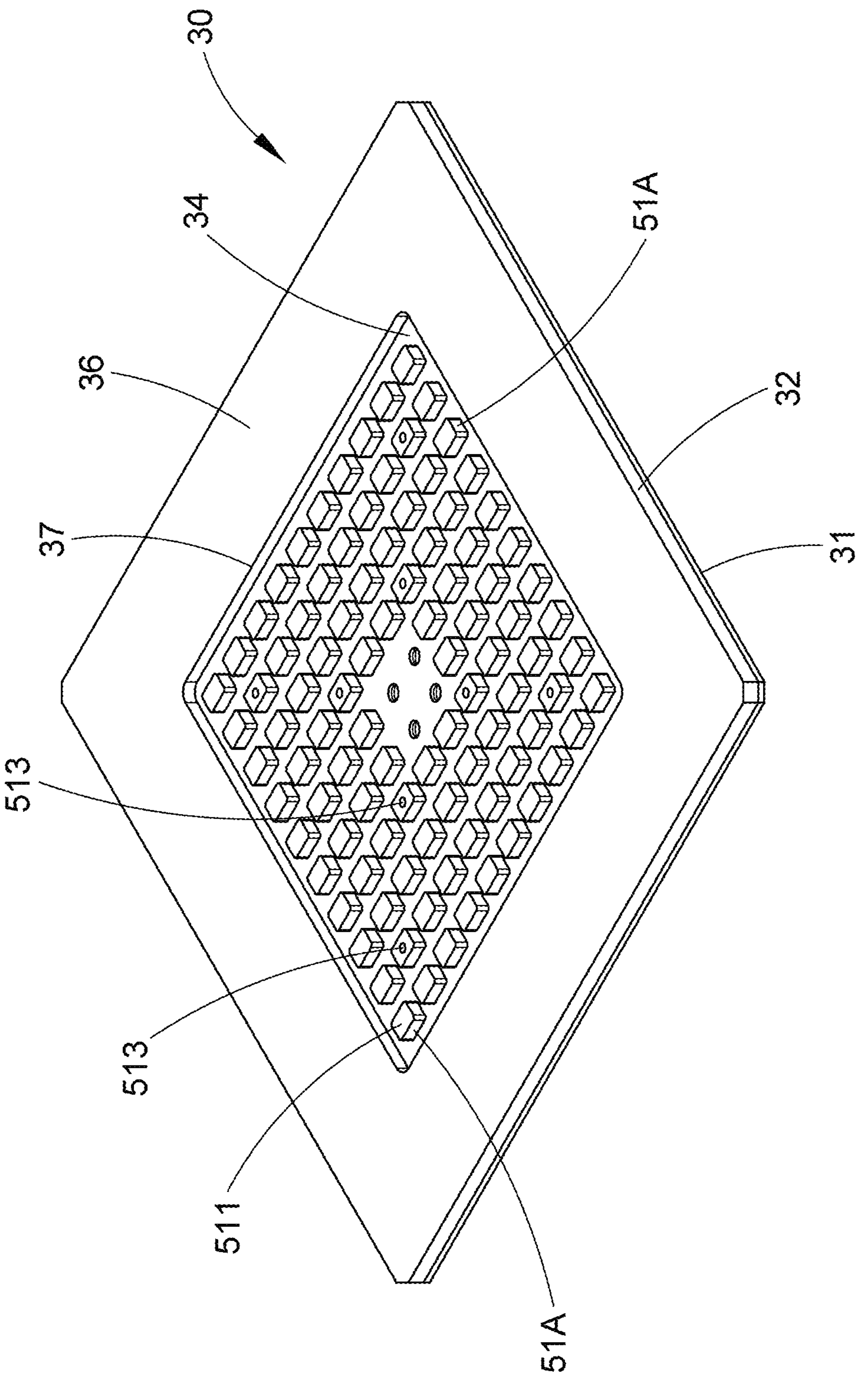
FIG. 4 is an assembled perspective view of an upper die unit and a plurality of upper supporting pillars of the probe seat.

In the configuration shown in FIG. 5*b*, the upper supporting pillars 51 monolithically extend from the lower surface 34 (i.e. supported surface) of the upper die unit 30, which means the upper supporting pillars 51 are monolithically connected with the die 32. The lower supporting pillars 52 monolithically extend from the upper surface 43 (i.e. supported surface) of the lower die unit 40, which means the lower supporting pillars 52 are monolithically connected with the die 41. As a result, the design that the supporting pillars are monolithically connected with the die makes the probe seat simple in structure, beneficial for manufacture and assembly, and further enhances the structural strength of the dies 32 and 41 themselves. The upper and lower supporting pillars 51A and 52A shown in FIG. 2 to FIG. 4 are similar to the above-described upper and lower supporting pillars 51 and 52 shown in FIG. 5*b*. Another kind of upper and lower supporting pillars 51B and 52B are also shown in FIG. 2, which will be specified hereinafter.

In this embodiment, the upper die unit 30 includes a connecting surface 36, and an upper recess 37 recessed from the connecting surface 36, as shown in FIG. 4. The aforementioned lower surface 34 is located in the upper recess 37, which means the lower surface 34 is the bottom surface of the upper recess 37. Similarly, the lower die unit 40 includes a connecting surface 46, and a lower recess 47 recessed from the connecting surface 46, as shown in FIG. 3. The aforementioned upper surface 43 is located in the lower recess 47, which means the upper surface 43 is the bottom surface of the lower recess 47. The connecting surface 36 of the upper die unit 30 and the connecting surface 46 of the lower die unit 40 are connected with each other after assembly. An accommodating space 241 is formed by the combination of the upper recess 37 and the lower recess 47. The accommodating space 241 accommodates the supporting structure 50, and is also arranged for the probes 25 to be inserted therethrough. More specifically speaking, the plurality of probes 25 of the probe card 20 are inserted through the upper through holes 35 respectively, inserted through the accommodating space 241, and inserted through the lower through holes 45 respectively. In the accommodating space 241, the place where no probe 25 is disposed can be arranged with the supporting pillars.

Figure 14A:
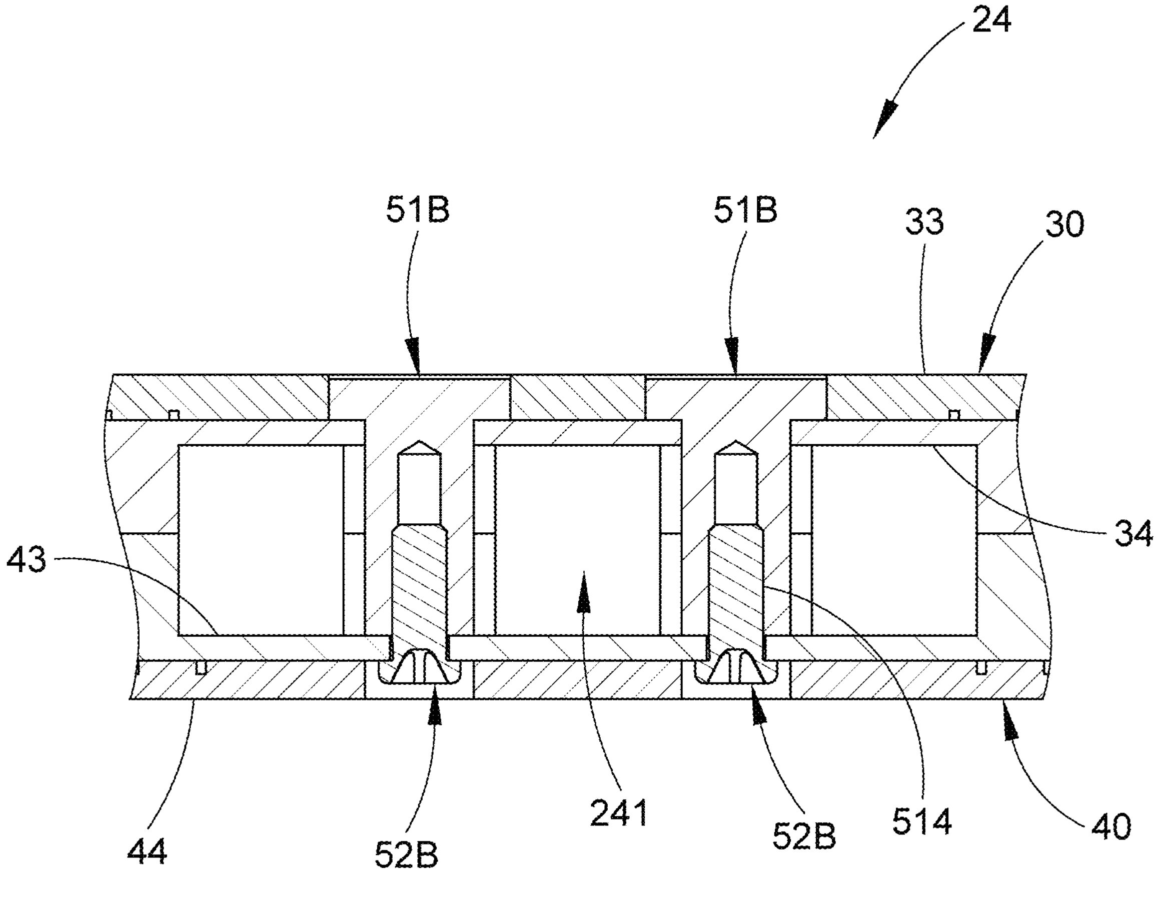
FIG. 14*a* is a sectional view of a part of the probe seat shown in FIG. 2.
Figure 14B:
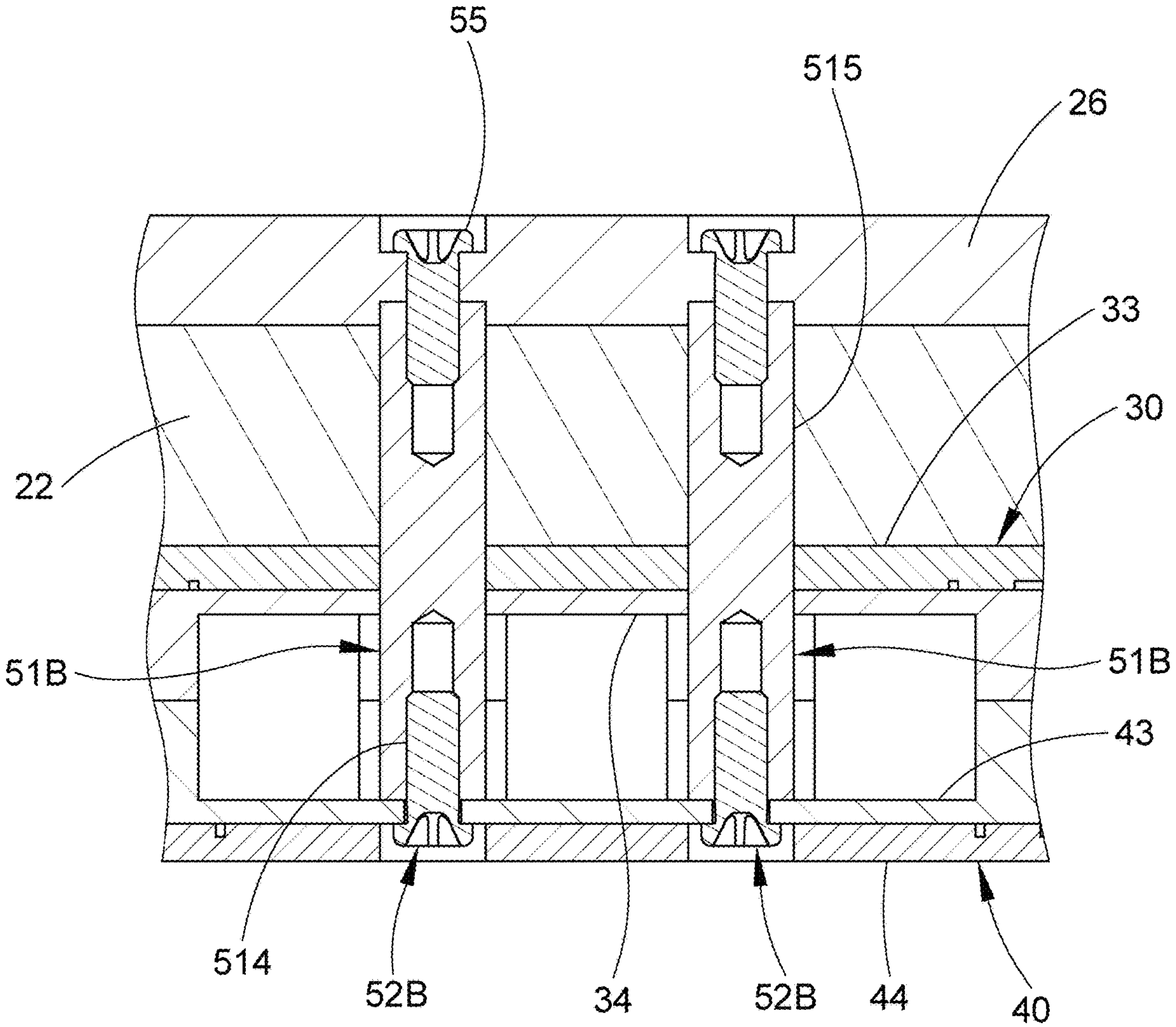
FIG. 14*b* is similar to FIG. 14*a*, but showing a different configuration of the supporting structure, and further showing a space transformer and a reinforcing member.
Figure 15:
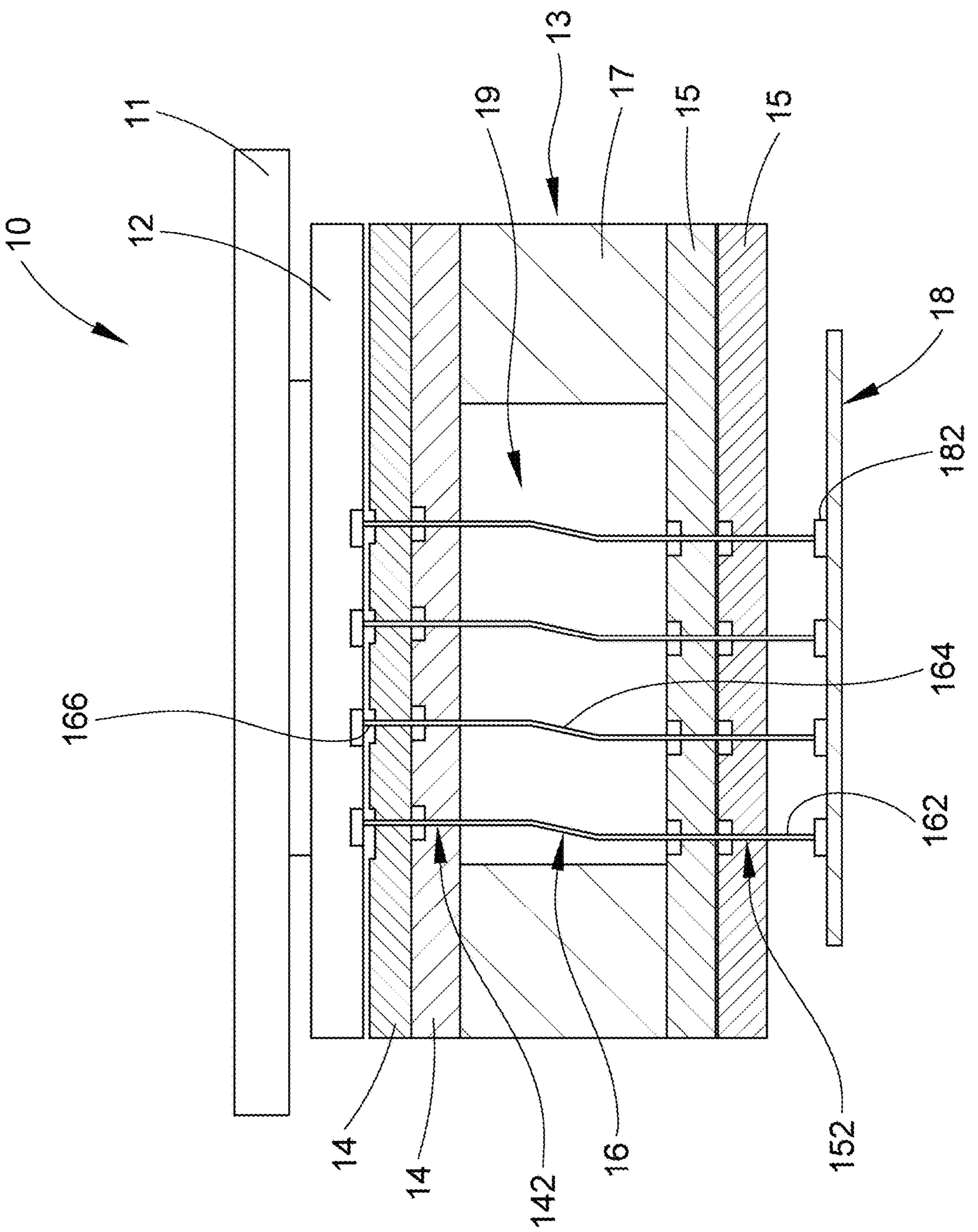
FIG. 15 PRIOR ART
FIG. 15 is a schematic sectional view of a conventional probe card and a device under test.

As shown in FIG. 5*b*, the upper supporting pillars 51 protrude from the lower surface 34 of the upper die unit 30, the lower supporting pillars 52 protrude from the upper surface 43 of the lower die unit 40, and the upper supporting pillars 51 are in contact with the lower supporting pillars 52 respectively. In the present invention, the contact between the upper and lower supporting pillars includes various kinds of contact manners, such as being abutted on each other as shown in FIG. 5*b* to FIG. 8, being embedded in each other as shown in FIG. 9, being fastened to each other in a screwing manner as shown in FIG. 14*a* and FIG. 14*b*, and so on, which will be specified hereinafter, as long as the upper and lower supporting pillars are not monolithically formed with each other but connected together when the probe seat is assembled.

As a result, the upper and lower supporting pillars 51 and 52 protrude from the upper and lower die units 30 and 40 respectively, and are in contact with each other. Such upper and lower supporting pillars 51 and 52 enhance the structural strength of the upper and lower die units 30 and 40 respectively. In addition, when the upper and lower die units 30 and 40 are connected with each other, the upper and lower supporting pillars 51 and 52 further collectively strengthen the part of the central section of the probe seat 24 with the accommodating space 241 and the resulting lower structural strength. Therefore, the probe seat 24, even in the large-area condition, is great in structural strength and thereby uneasy to be deformed, so that the deformation of the lower die unit 40 caused by the reacting force from the device under test will be reduced.

In the present invention, the upper and lower die units 30 and 40 are unlimited to include the upper and lower recesses 37 and 47, which means the supporting pillars are unlimited to be located in the recess. The connecting surfaces of the upper and lower die units 30 and 40 may be also their lower surface and upper surface respectively, so that the supporting pillars protrude from the connecting surfaces. In such case, a hollow middle die or other supportive structures can be disposed between the upper and lower die units 30 and 40 to form the accommodating space 241 for accommodating the supporting structure 50 and the probes 25. In other words, the accommodating space 241 is only required to be formed around the plurality of supporting pillars, including the upper and lower supporting pillars 51 and 52, and formed between the upper and lower die units 30 and 40. However, the configuration design that the upper and lower supporting pillars 51 and 52 are located in the upper and lower recesses 37 and 47 of the upper and lower die units 30 and 40 is simple in structure, beneficial for manufacture and assembly, great in structural strength, and can prevent the upper and lower supporting pillars 51 and 52 from completely protruding outside and the resulting ease of being collided or damaged when the assembly of the probe seat 24 is not accomplished. Especially, in the configuration shown in FIG. 5*b*, each of the upper and lower supporting pillars 51 and 52 has an end surface 511 or 521. The end surfaces 511 of the upper supporting pillars 51 are flush with the connecting surface 36 of the upper die unit 30. The end surfaces 521 of the lower supporting pillars 52 are flush with the connecting surface 46 of the lower die unit 40. In this way, the structures composed of the upper and lower supporting pillars 51 and 52 and the upper and lower die units 30 and 40 respectively are simple, and have great structural strength. Besides, the upper and lower supporting pillars 51 and 52 are completely located in the upper and lower recesses 37 and 47, and thereby can be further prevented from collision or damage. In addition, in the condition that the upper and lower supporting pillars 51 and 52 monolithically extend from the lower surface 34 and the upper surface 43 respectively, the design that the end surfaces 511 and 521 of the upper and lower supporting pillars 51 and 52 are flush with the connecting surfaces 36 and 46 of the upper and lower die units 30 and 40 respectively makes the manufacture relatively easier. However, the end surface 511 and 521 of the upper and lower supporting pillars 51 and 52 may be not flush with the connecting surface 36 and 46 of the upper and lower die units 30 and 40. For example, in the configuration shown in FIG. 6, the end surfaces 511 and 521 of the upper and lower supporting pillars 51 and 52 are higher than the connecting surfaces 36 and 46 of the upper and lower die units 30 and 40 respectively. Alternatively, in the configuration shown in FIG. 8, the end surfaces 511 and 521 of some of the upper and lower supporting pillars 51 and 52 are flush with the connecting surfaces 36 and 46 of the upper and lower die units 30 and 40 respectively, and the end surfaces 511 and 521 of the other upper and lower supporting pillars 51 and 52 are lower than the connecting surfaces 36 and 46 of the upper and lower die units 30 and 40 respectively.

Figure 6:
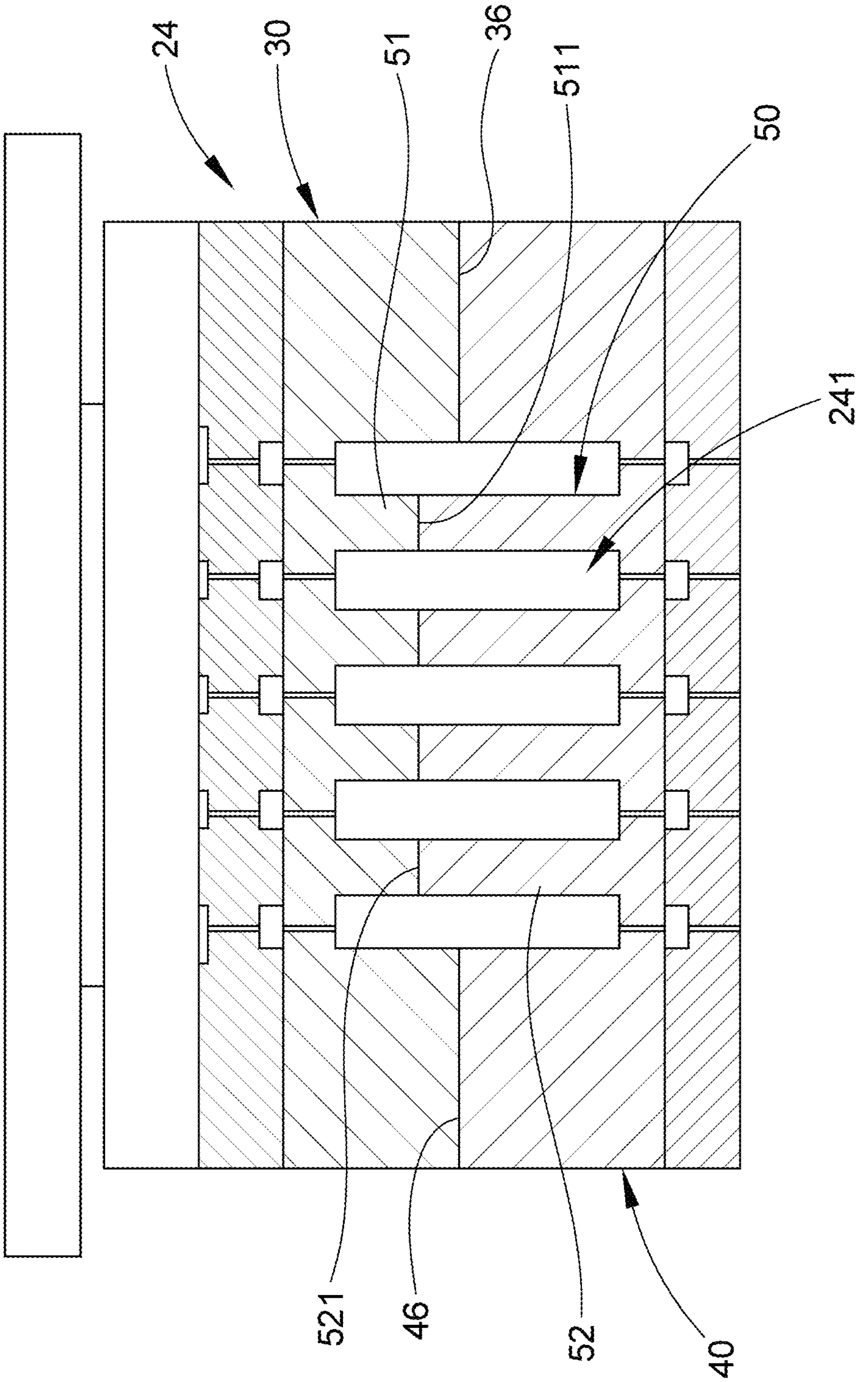
FIG. 6 to FIG. 10 are similar to FIG. 5*b*, but showing different configurations of the probe seat, and not showing any probe.
Figure 8:
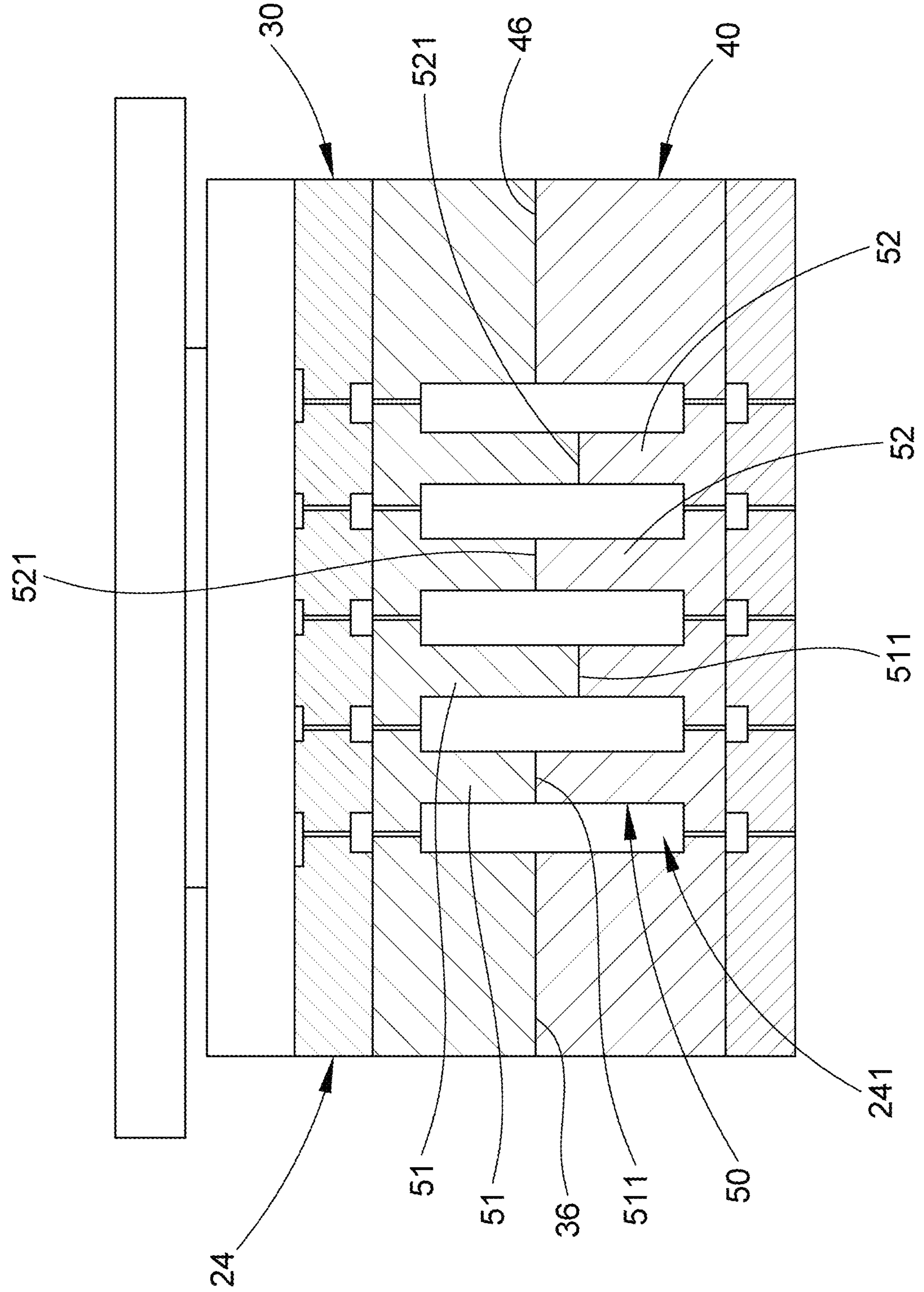
Figure 9:
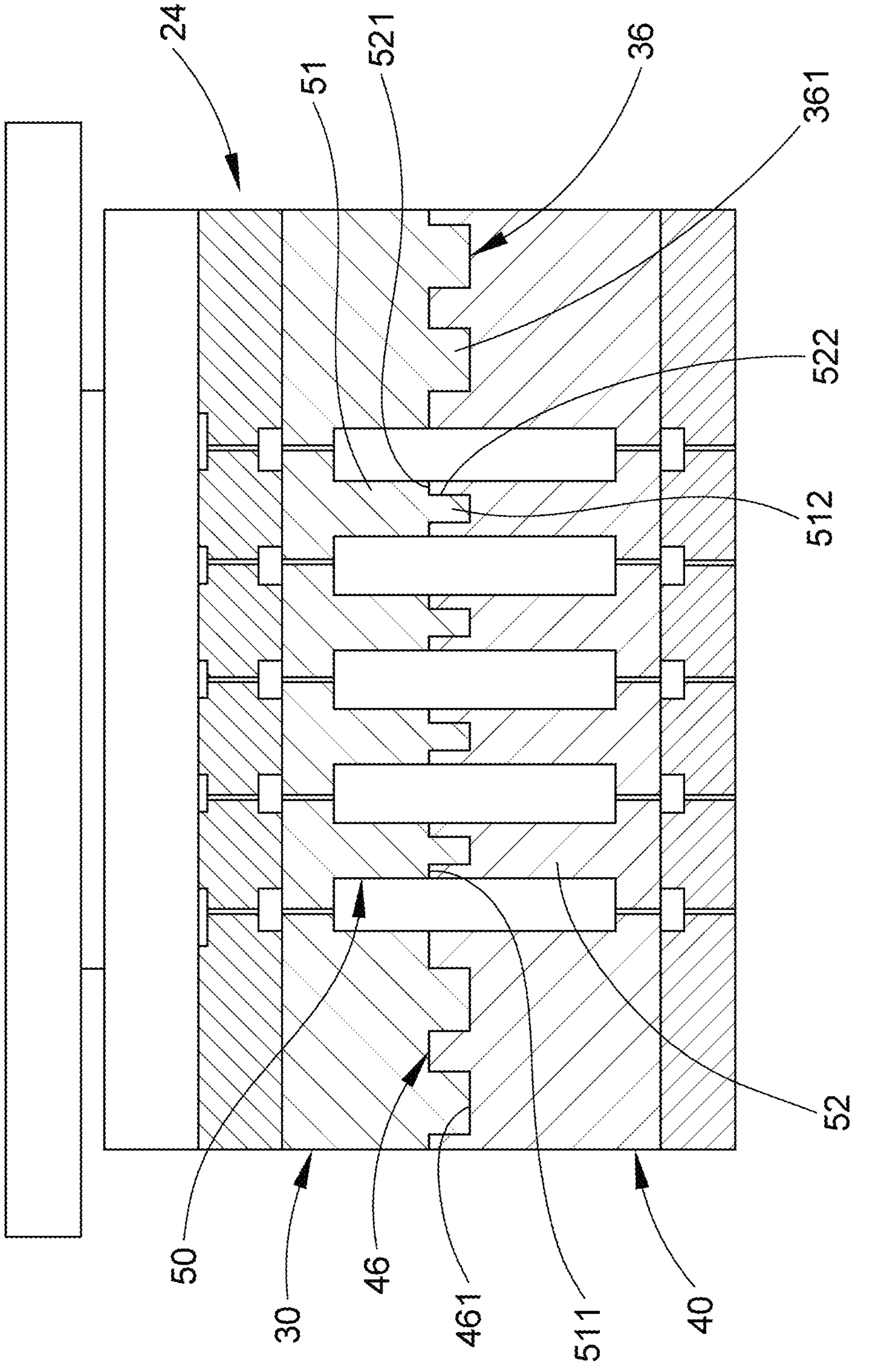

In the configurations shown in FIG. 5*b*, FIG. 6 and FIG. 8, for the upper and lower supporting pillars 51 and 52 in contact with each other, the end surfaces 511 of the upper supporting pillars 51 and the end surfaces 521 of the lower supporting pillars 52 are abutted on each other. In this way, the probe seat 24 has great push resisting rigidity for resisting the inward pushing external force, thereby preventing the die unit from being deformed by the received force. Furthermore, the upper and lower supporting pillars 51 and 52 in contact with each other may be further fixed to each other by gluing, which means before the end surfaces 511 and 521 of the upper and lower supporting pillars 51 and 52 are abutted on each other, glue can be disposed on at least one of the end surfaces 511 and 521, so that when the end surfaces 511 and 521 of the upper and lower supporting pillars 51 and 52 are abutted on each other, they are fixed to each other by gluing at the same time. Such fixing manner is simple, convenient and firm, capable of further improving the push resisting rigidity and the pull resisting rigidity for resisting the inward pushing external force and the outward pulling external force, thereby preventing the die unit from being deformed by the received force.

Figure 7:
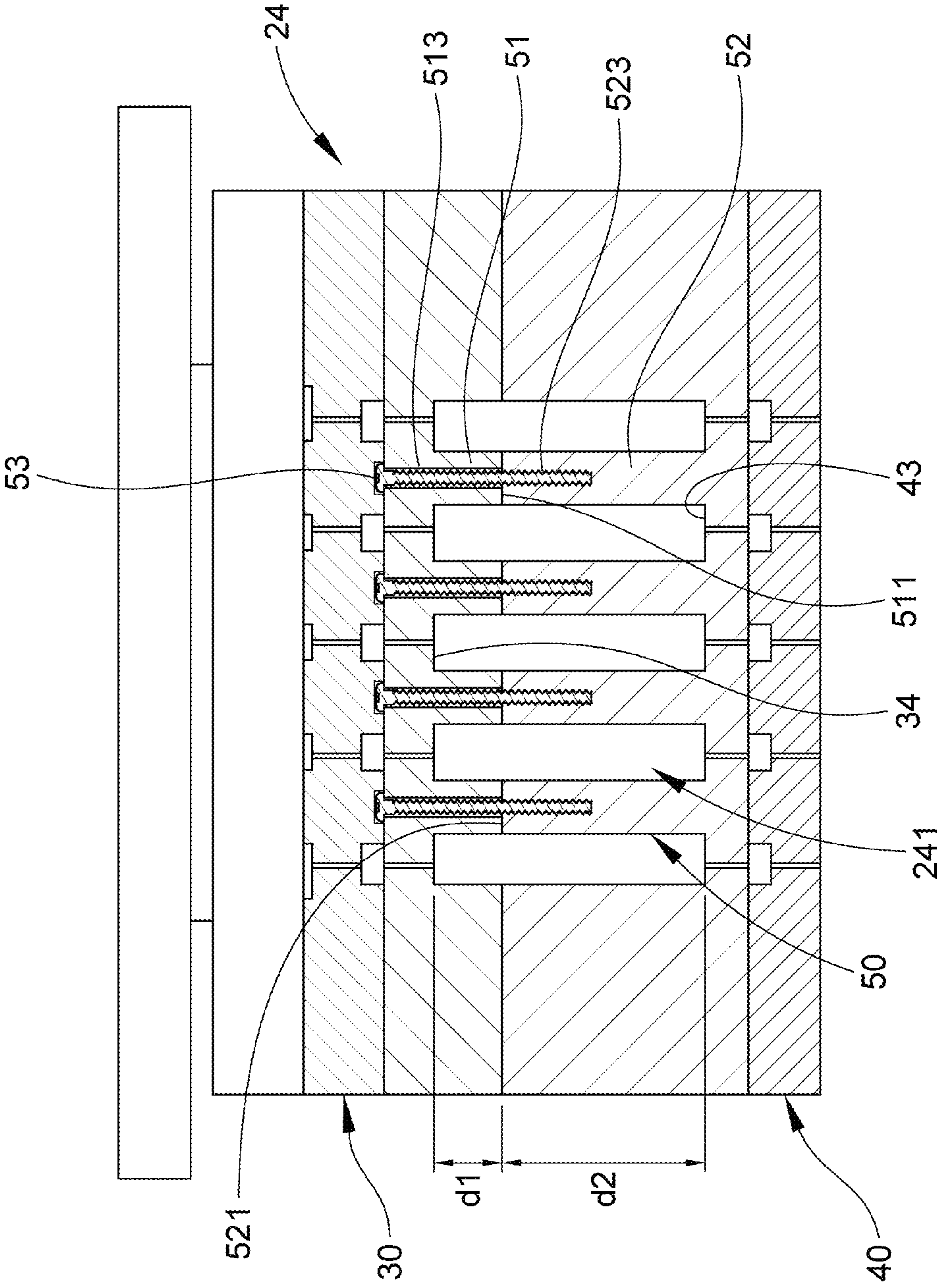

As shown in FIG. 7, the upper and lower supporting pillars 51 and 52 in contact with each other may be further fastened to each other by a bolt 53. As a result, the design that the end surface 511 and 521 of the upper and lower supporting pillars 51 and 52 are abutted on each other can improve the push resisting rigidity for resisting the inward pushing external force. The design that the upper and lower supporting pillars 51 and 52 are further fastened to each other by the bolt 53 can improve the pull resisting rigidity for resisting the outward pulling external force. Therefore, the effect of preventing the die unit from deformation is great. The bolt 53 is unlimited to be screwed downwardly or upwardly for fastening. In the configuration shown in FIG. 7, the bolt 53 is screwed downwardly for fastening. Specifically speaking, the upper supporting pillar 51 has a through hole 513, and the lower supporting pillar 52 has a threaded hole 523. The bolt 53 is inserted through the through hole 513 of the upper supporting pillar 51, and then screwed into the threaded hole 523 of lower supporting pillar 52. Such screwing direction for fastening can avoid orienting the head portion of the bolt toward the device under test, which may affect the device under test if the bolt loosens. Besides, the distance d1 between the end surface 511 of the upper supporting pillar 51 and the lower surface 34 of the upper die unit 30, i.e. the length of the upper supporting pillar 51, is smaller than the distance d2 between the end surface 521 of the lower supporting pillar 52 and the upper surface 43 of the lower die unit 40, i.e. the length of the lower supporting pillar 52. In this way, the lower supporting pillar 52 can be provided with the threaded hole long enough for the bolt 53 to be screwed therein firmly.

Figure 13:
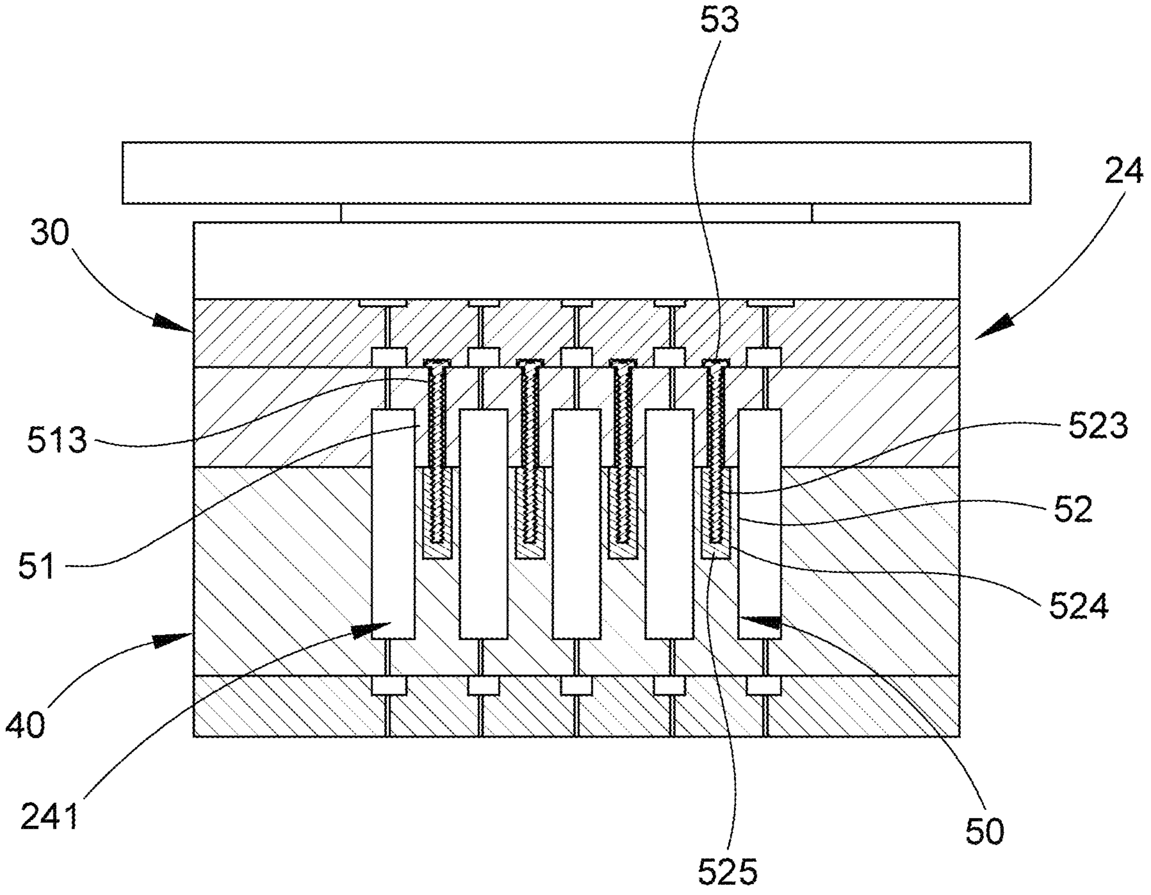
FIG. 13 is similar to FIG. 7, but showing a different configuration of the probe seat.

In the configuration shown in FIG. 7, the threaded hole 523 is formed in the rod of the lower supporting pillar 52 itself by tapping. However, as shown in FIG. 13, the rod of the lower supporting pillar 52 itself may be firstly drilled with an installation hole 524, and then a sleeve 525 having the threaded hole 523 is fixed into the installation hole 524, so that the bolt 53 can be firstly inserted through the through hole 513 of the upper supporting pillar 51 and then screwed into the threaded hole 523 of the sleeve 525.

According to the requirement of the practical configuration, the above-described fastening structure may be provided in some of the supporting pillars, unlimited to be provided in all supporting pillars. For example, in the probe seat 24 shown in FIG. 1 to FIG. 4, only some of the upper and lower supporting pillars 51A and 52A are provided with the through hole 513 and the threaded hole 523, and fastened by the bolt 53.

As shown in FIG. 9, the upper and lower supporting pillars 51 and 52 in contact with each other may further have a recess and a protrusion embedded in the recess. Specifically speaking, in FIG. 9, the upper supporting pillar 51 includes a protrusion 512 located on the end surface 511, the lower supporting pillar 52 includes a recess 522 located on the end surface 521, and the protrusion 512 is embedded in the recess 522. As a result, the design that the end surfaces 511 and 521 of the upper and lower supporting pillars 51 and 52 are abutted on each other can improve the push resisting rigidity for resisting the inward pushing external force. The design that the protrusion 512 of the upper supporting pillar 51 is embedded in the recess 522 of the lower supporting pillar 52 can further improve the push resisting rigidity and the pull resisting rigidity for resisting the inward pushing external force and the outward pulling external force, so as to prevent the die unit from being deformed by the received force. Besides, the connecting surface 36 of the upper die unit 30 and the connecting surface 46 of the lower die unit 40 may also have recesses and protrusions embedded in the recesses. For example, in FIG. 9, the connecting surface 36 of the upper die unit 30 includes a plurality of protrusions 361, the connecting surface 46 of the lower die unit 40 includes a plurality of recesses 461, and the protrusions 361 are embedded in the recesses 461 respectively, which can further improve the push resisting rigidity and the pull resisting rigidity of the probe seat 24 to prevent the die unit from being deformed by the received force. Before the aforementioned protrusion is embedded in the recess, glue can be disposed on at least one of the protrusion and the recess, so that when the protrusion is embedded in the recess, they are fixed to each other by gluing at the same time. Such fixing effect is relatively firmer, further improving the push resisting rigidity and the pull resisting rigidity. Besides, the recess and the protrusion also facilitate alignment and/or positioning during the assembly.

Figure 11:
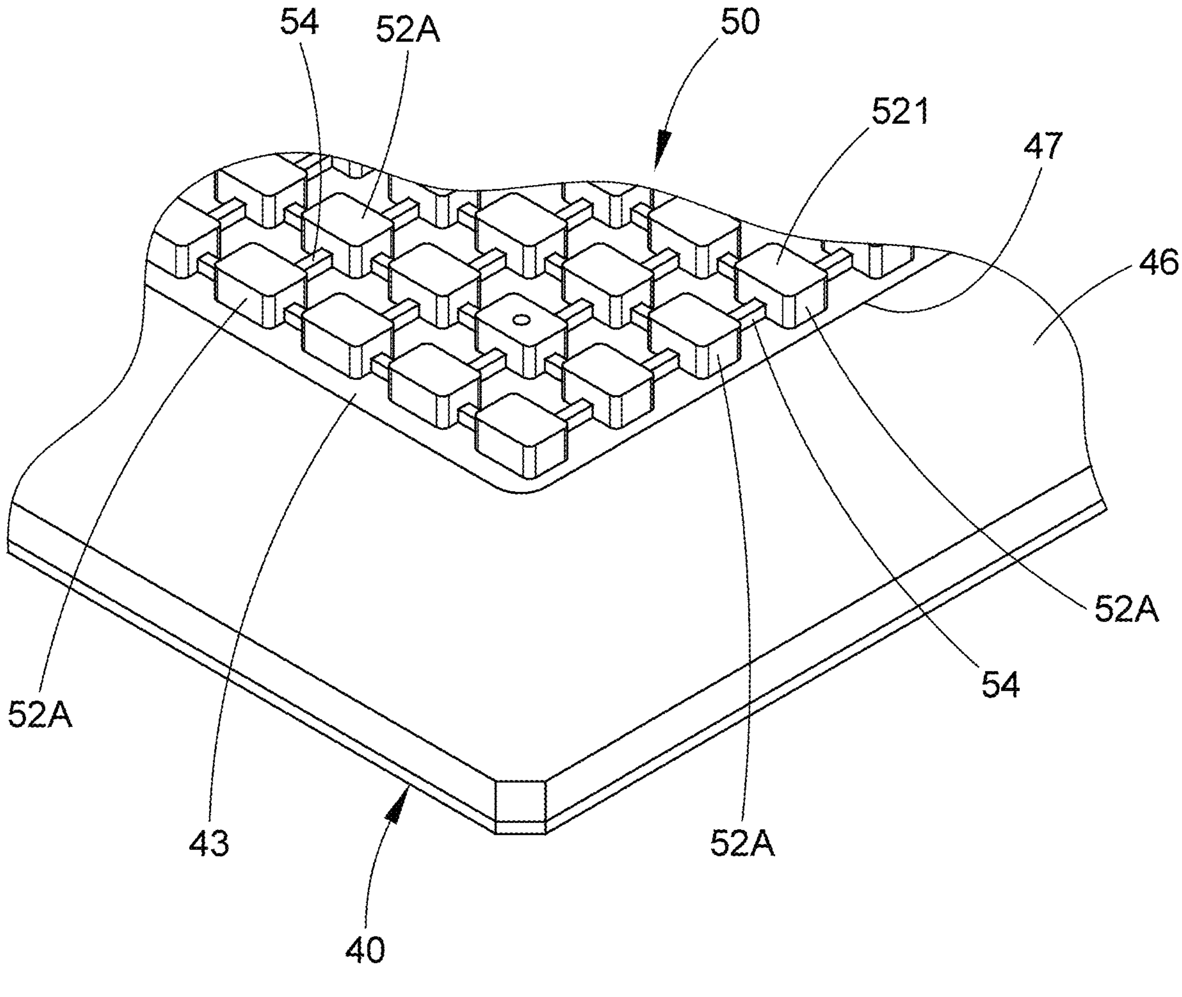
FIG. 11 is a partial perspective view of another configuration of the die unit and the supporting structure.

As shown in FIG. 11, the supporting structure 50 may further include a plurality of connecting ribs 54. Each connecting rib 54 is connected to two adjacent supporting pillars and the supported surface which the two adjacent supporting pillars are located on. For example, the connecting rib 54 shown in FIG. 11 is monolithically connected to two adjacent lower supporting pillars 52A and the upper surface 43 of the lower die unit 40. As a result, in the space between the supporting pillars, the place where no probe 25 has to be disposed can be arranged with the connecting rib 54. The connecting rib 54 can enhance the structural strength of the supporting pillars and the die unit connected with the connecting rib, thereby further preventing the probe seat from being deformed by the received force.

In the condition that it is uneasy to monolithically form the supporting pillars with the die by processing or in the condition of meeting other requirements, the supporting pillars may be elements not monolithically formed with the die but installed to the die unit by assembling. In other words, in the supporting structure 50 of the probe seat 24 of the present invention, the supporting pillars may be all or partially attached to their situated die unit non-monolithically, such as the upper and lower supporting pillars 51B and 52B shown in FIG. 2 and FIG. 14*a*, wherein the upper supporting pillar 51B is a rod, such as teel rod or other metal rod, and the lower supporting pillar 52B is a bolt. Alternatively, the upper supporting pillar 51B may be a bolt, and the lower supporting pillar 52B is a rod. In FIG. 2 and FIG. 14*a*, the upper supporting pillar 51B is inserted through the upper die unit 30, and has a threaded hole 514. The lower supporting pillar 52B is inserted through the lower die unit 40, and screwed into the threaded hole 514. In other words, the upper and lower supporting pillars 51B and 52B are connected with each other in a directly screwing manner. Such structure is simple, easy in manufacture and assembly, and firm in connection effect, capable of resisting not only the inward pushing external force but also the outward pulling external force, thereby achieving great effect of preventing the die unit from deformation. As shown in FIG. 2, the probe seat of the present invention may, but unlimited to, include both the supporting pillar monolithically connected with the die, i.e. the upper and lower supporting pillars 51A and 52A, and the supporting pillar non-monolithically attached to the die unit by assembling, i.e. the upper and lower supporting pillars 51B and 52B, which can be arranged according to the requirement.

As shown in FIG. 14*b*, the upper supporting pillar 51B (the rod) may further extend upwardly to protrude out of the upper die unit 30. In other words, the upper supporting pillar 51B (the rod) may include an extending section 515 protruding out of the upper surface 33 of the upper die unit 30. Alternatively, in the condition that the lower supporting pillar 52B is the rod, the lower supporting pillar 52B may include an extending section protruding out of the lower surface 44 of the lower die unit 40. As a result, the extending section 515 can be abutted against a reinforcing member 26. The reinforcing member 26 may be another member of the probe card. For example, in FIG. 14*b*, the reinforcing member 26 is another member mounted on the space transformer 22. The extending section 515 of the upper supporting pillar 51B is inserted through the space transformer 22, and then inserted into and engaged with the reinforcing member 26. The extending section 515 may be even further fastened to the reinforcing member 26 by another bolt 55. By the aforementioned extending section 515 of the rod protruding out of the upper surface 33 of the upper die unit 30 or the lower surface 44 of the lower die unit 40 so as to be abutted against and even fastened to the reinforcing member, the structural strength of the probe seat can be further enhanced.

In the present invention, the plurality of supporting pillars of the supporting structure 50 may not only include the above-described upper and lower supporting pillars in contact with each other, but also include at least one individual supporting pillar. The individual supporting pillar is not in contact with any other supporting pillar, but individually supported between the lower surface 34 of the upper die unit 30 and the upper surface 43 of the lower die unit 40. The individual supporting pillar may be like the upper supporting pillar 51B shown in FIG. 14*a* or FIG. 14*b*, inserted through the upper die unit 30 and abutted on the upper surface 43 of the lower die unit 40, but not fastened by a bolt inserted through of the lower die unit 40. Alternatively, the individual supporting pillar may be inserted through the lower die unit 40, abutted on the lower surface 34 of the upper die unit 30, and not fastened by a bolt inserted through of the upper die unit 30.

As a result, the part of the central section of the probe seat 24 with the accommodating space 241 and the resulting lower structural strength not only can be strengthened by the upper and lower supporting pillars 51 and 52 in contact with each other collectively, but also can be further strengthened by the additional individual supporting pillar which can be especially disposed at the portion the supporting pillar integrated with the die is uneasy to be made by processing or the portion the bolt for fastening is unable to be disposed, so that the portion can be also structurally strengthened.

Figure 10:
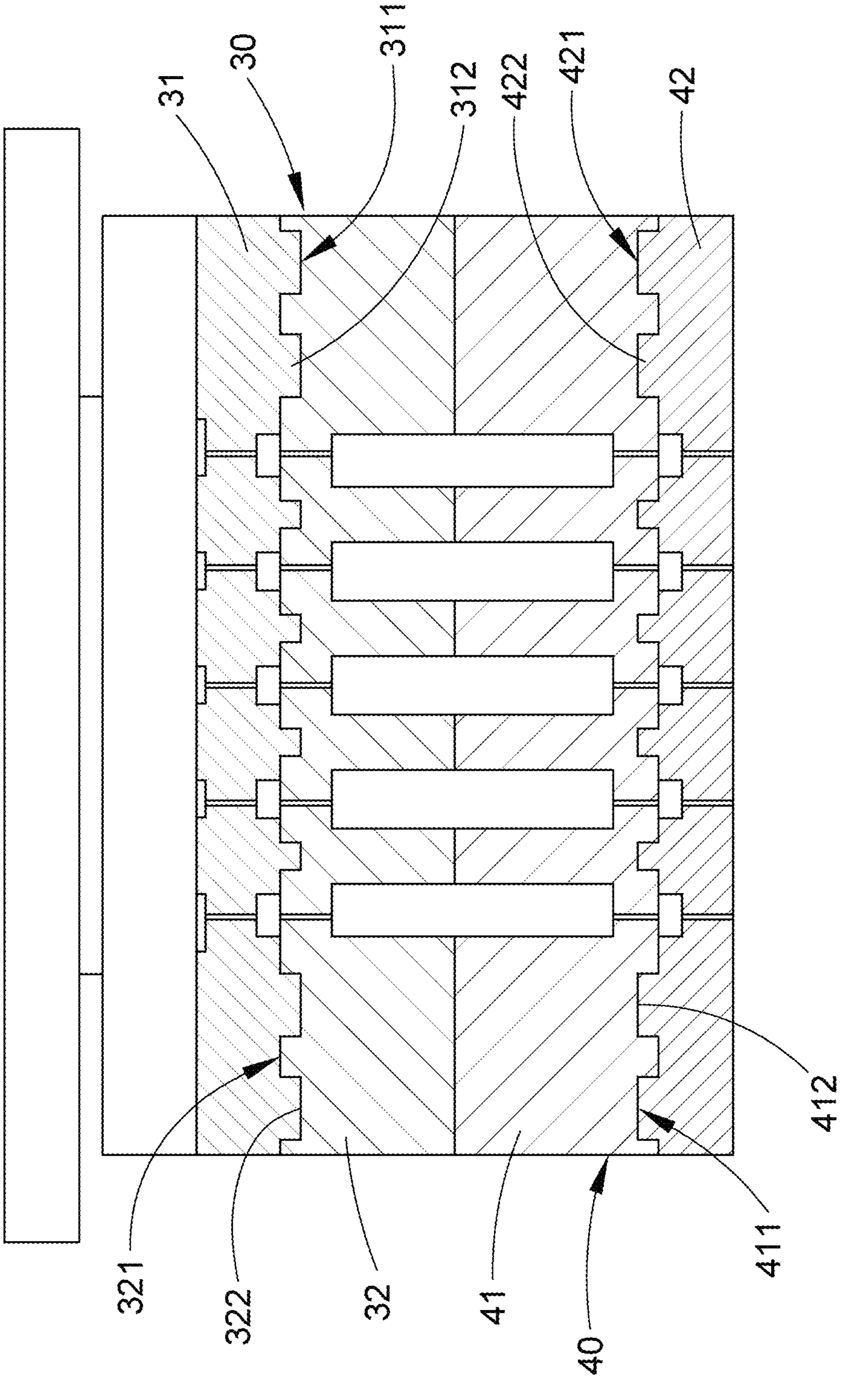

As shown in FIG. 10, in the condition that at least one of the upper and lower die units 30 and 40 includes a plurality of dies, the dies included in the same die unit and piled on one another may be provided therebetween with recesses and protrusions embedded in the recesses. For example, in FIG. 10, each of the dies 31 and 32 of the upper die unit 30 includes a joining surface 311 or 321. The joining surface 311 includes a plurality of protrusions 312. The joining surface 321 includes a plurality of recesses 322. When the joining surfaces 311 and 321 of the dies 31 and 32 are connected with each other, the protrusions 312 are embedded in the recesses 322 respectively. Similarly, each of the dies 41 and 42 of the lower die unit 40 includes a joining surface 411 or 421. The joining surface 421 includes a plurality of protrusions 422. The joining surface 411 includes a plurality of recesses 412. When the joining surfaces 411 and 421 of the dies 41 and 42 are connected with each other, the protrusions 422 are embedded in the recesses 412 respectively.

As a result, the design that the upper and lower die units 30 and 40 are each composed of two dies connected with each other can make the upper and lower die units 30 and 40 so thick as to have great structural strength even in the large-area condition, and can also avoid a drilling problem caused by too large aspect ratio for drilling a single thick die. Besides, the design that the joining surfaces 311 and 321 of the dies 31 and 32 of the upper die unit 30 are embedded in each other by the recesses and protrusions thereof not only improves the connecting effect of the dies 31 and 32 but also facilitates the alignment of the dies 31 and 32. Similarly, the recesses and protrusions of the joining surfaces 411 and 421 of the dies 41 and 42 of the lower die unit 40 also improve the connecting effect thereof and facilitate the alignments of the dies 41 and 42.

It can be known from the above description that the probe seat of the present invention is suitable to be applied to the large-area probe card. For example, the large-area probe seat refers to that the area of the entire probe arrangement region in the upper and lower die units 30 and 40 is equal to or larger than a 60-millimeter square. Accordingly, the probe seat can be disposed with a large number of probes for testing a plurality of DUTs at the same time, making the probe card have both great structural strength and testing efficiency. In particular, for matching the current multi-DUT testing manner, the probe seat of the present invention may adopt the peripheral type probe arrangement as shown in FIG. 12*a*, or the skipping DUT type probe arrangement as shown in FIG. 12*b*, which will be specified hereinafter.

Figure 12A:
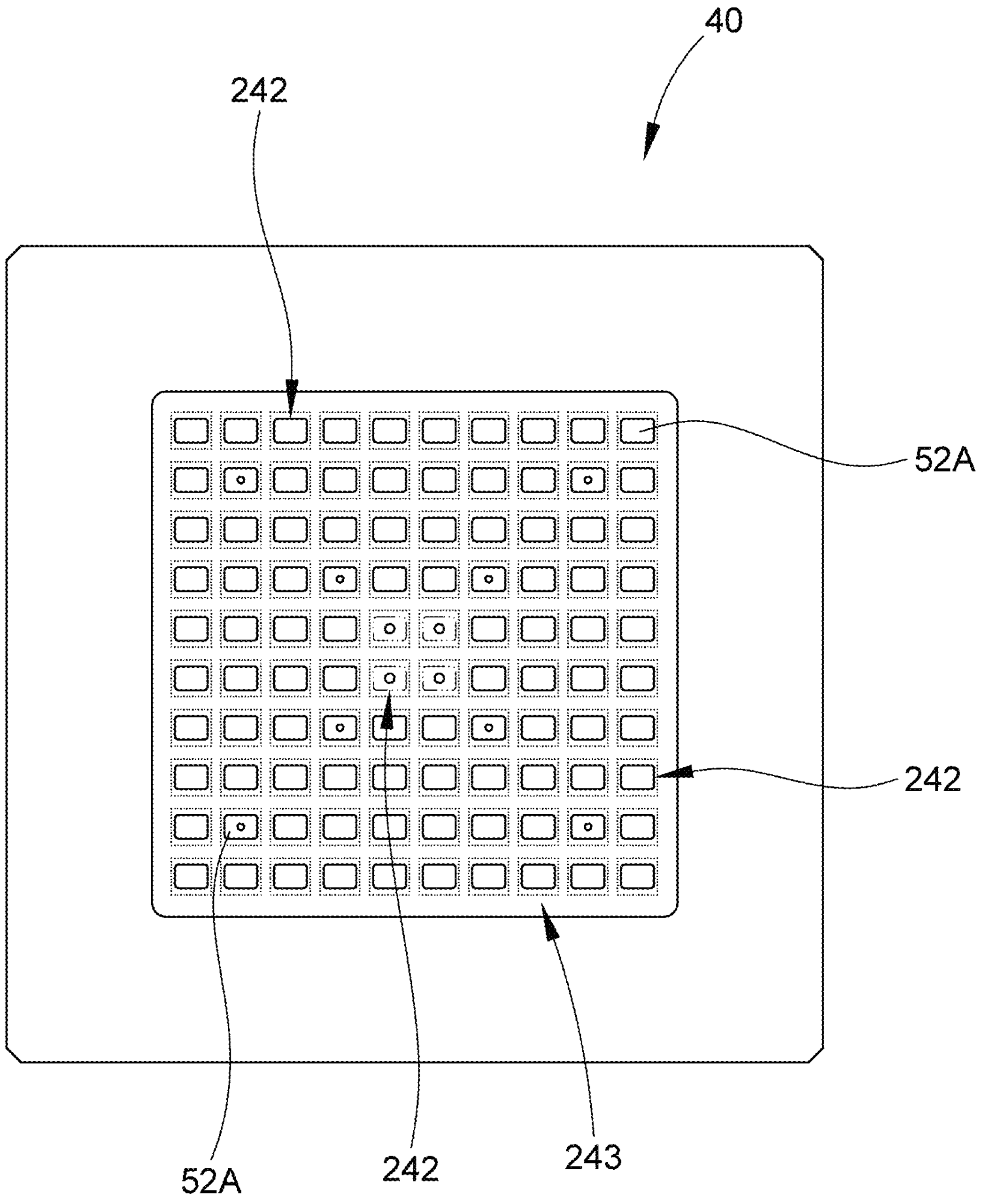
FIG. 12*a* is a top view of FIG. 3.

FIG. 12*a* is a schematic top view of the lower die unit 40 and the lower supporting pillars 52A shown in FIG. 3, but tiny points representing the lower through holes for the probes to be inserted therethrough are schematically shown in FIG. 12*a* in a way that every non-probe zone 242 is surrounded by the points arranged in a circle, so as to schematically show non-probe zones 242 and a probe zone 243 of the probe seat 24 shown in FIG. 1 to FIG. 4. The place where each lower supporting pillar 52A is located is a non-probe zone 242. The four areas represented by imaginary lines at the center of the lower die unit 40 are arranged to dispose the upper and lower supporting pillars 51B and 52B. Each of the four areas is also a non-probe zone 242. The non-probe zones 242 are arranged in a matrix. The probes are arranged on the peripheries of these non-probe zones 242, which means the areas between the adjacent non-probe zones 242 and the areas on the periphery of all the non-probe zones 242 are the places where the probes are inserted. These areas for the probes are connected with each other into a grid pattern without separation. Therefore, this kind of probe seat is defined as including a plurality of non-probe zones 242 and a probe zone 243. The probe zone 243 is distributed in a grid pattern on the periphery of all the non-probe zones 242 and between the non-probe zones 242. The aforementioned upper through holes 35 of the upper die unit 30 and the lower through holes 45 of the lower die unit 40 are all distributed in the probe zone 243 for the probes 25 to be inserted through the upper and lower through holes 35 and 45. In other words, the areas between the adjacent non-probe zones 242 and the area on the periphery of all the non-probe zones 242 are collectively regarded as a probe zone 243 shaped as a grid, and the non-probe zones 242 are regarded as meshes of the grid. The non-probe zones 242 in such arrangement can make the supporting pillars distributed relatively evener, thereby making the probe seat attain great structural strength.

Figure 12B:
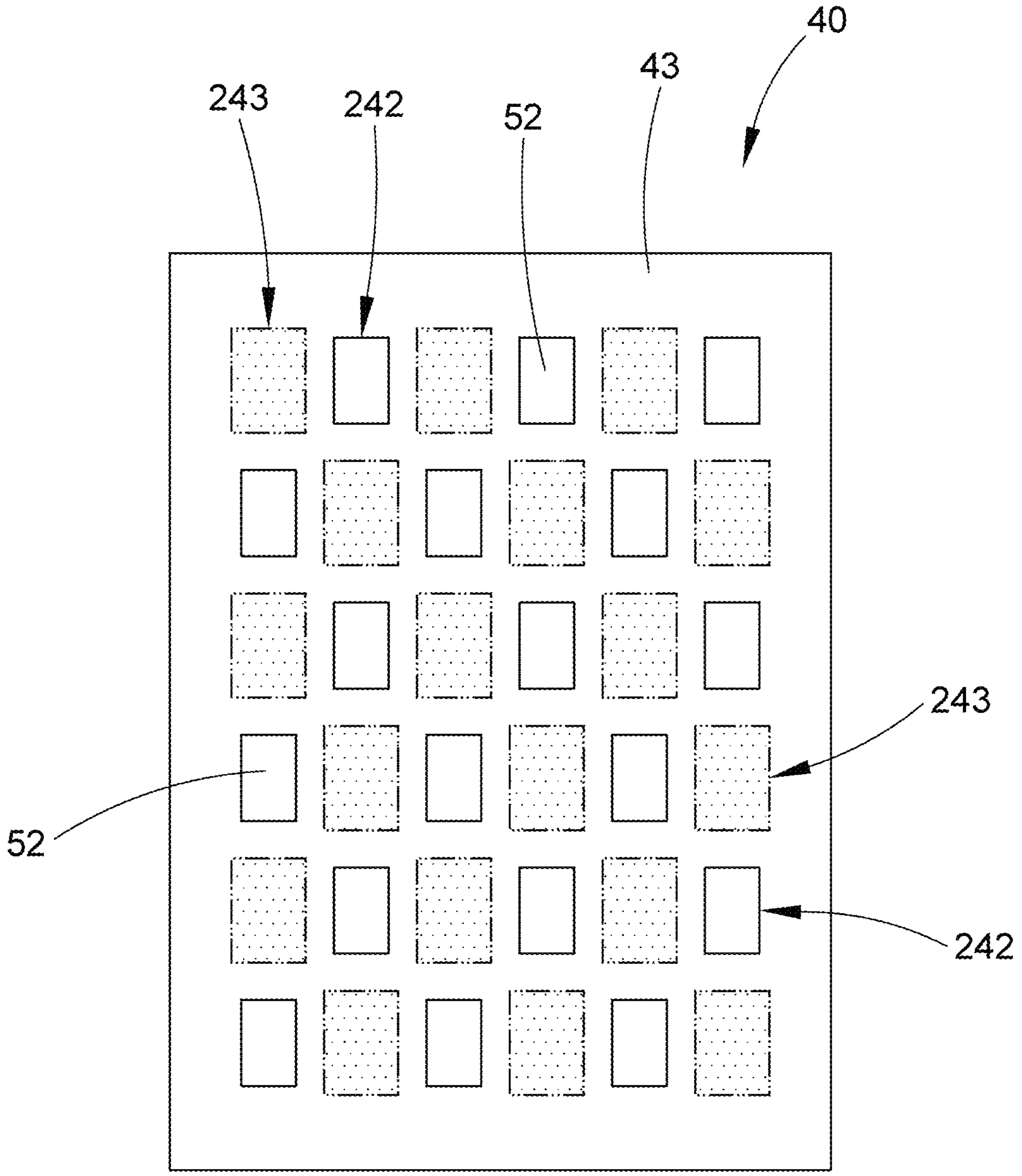
FIG. 12*b* is a schematic view of still another configuration of the die unit and some of the supporting pillars of the supporting structure.

Similarly, in FIG. 12*b*, probe zones 243 and non-probe zones 242 of the probe seat are schematically shown on the lower die unit 40. This kind of probe seat includes a plurality of probe zones 243 and a plurality of non-probe zones 242, which are distributed in a staggered manner. The probe zones 243 and the non-probe zones 242 are collectively arranged in a matrix. Being distributed in a staggered manner refers to that the probe zones 243 are all adjacent to the non-probe zones 242, but not adjacent to any probe zone 243; the non-probe zones 242 are all adjacent to the probe zones 243, but not adjacent to any non-probe zone 242. The aforementioned upper through holes 35 of the upper die unit 30 and the lower through holes 45 of the lower die unit 40 are all distributed in the probe zones 243 for the probes 25 to be inserted through the upper and lower through holes 35 and 45. The lower through holes are represented by points schematically shown in FIG. 12*b*. This kind of probe seat is adapted for the testing manner of testing the non-adjacent DUTs at the same time, which is usually called skipping DUT. When the test is performed, all the probe zones 243 and non-probe zones 242 are each located correspondingly to a DUT, but only the probe zones 243 have the probes. Therefore, the DUTs located correspondingly to the non-probe zones 242 are not tested. In the next time of test, the probe card only needs to be moved for a small distance to make the probe zones 243 moved to the positions of the non-probe zones 242 in the last time of test, so as to test the DUTs not tested in the last time of test. Because there are non-probe zones 242 with quite large area between the probe zones 243, the supporting pillars, including the lower supporting pillars 52 shown in FIG. 12*b*, can be arranged in the non-probe zones 242. Every two probe zones 243 are provided with a non-probe zone 242 therebetween for the arrangement of the supporting pillars, which can make the probe seat attain great structural strength.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A probe seat comprising:

two die units comprising:

an upper die unit comprising an upper surface, a lower surface, and a plurality of upper through holes penetrating through the upper surface and the lower surface of the upper die unit; and a lower die unit comprising an upper surface, a lower surface, and a plurality of lower through holes penetrating through the upper surface and the lower surface of the lower die unit;

a supporting structure comprising a plurality of supporting pillars, the supporting pillars being disposed between the upper die unit and the lower die unit; and an accommodating space formed around the supporting pillars and between the upper die unit and the lower die unit, the accommodating space being adapted for a plurality of probes to be inserted through the upper through holes, the accommodating space, and the lower through holes, respectively;

wherein the supporting pillars comprise a plurality of upper supporting pillars and a plurality of lower supporting pillars; the upper supporting pillars protrude out of the lower surface of the upper die unit; the lower supporting pillars protrude out of the upper surface of the lower die unit; the upper supporting pillars are in contact with the lower supporting pillars, respectively;

wherein the upper die unit comprises a connecting surface, and an upper recess recessed from the connecting surface of the upper die unit; the lower surface of the upper die unit is located in the upper recess; the lower die unit comprises a connecting surface, and a lower recess recessed from the connecting surface of the lower die unit; the upper surface of the lower die unit is located in the lower recess; the connecting surface of the upper die unit and the connecting surface of the lower die unit are connected with each other; the accommodating space is formed by a combination of the upper recess are the lower recess.

2. The probe seat as claimed in claim 1, wherein the lower surface of the upper die unit and the upper surface of the lower die unit are each defined as a supported surface; at least one or more of the supporting pillars of the supporting structure monolithically extend from the respective supported surface.

3. The probe seat as claimed in claim 1, wherein at least one or more of the supporting pillars of the supporting structure are attached to the respective die unit non-monolithically.

4. The probe seat as claimed in claim 3, wherein for the upper supporting pillar and the lower supporting pillar in contact with each other, one of them is a rod and the other is a bolt; the rod and the bolt are inserted through the two die units respectively; the rod has a threaded hole; the bolt is screwed into the threaded hole of the rod.

5. The probe seat as claimed in claim 4, wherein the rod comprises an extending section protruding out of one of the upper surface of the upper die unit and the lower surface of the lower die unit; the extending section is adapted to be abutted against a reinforcing member.

6. The probe seat as claimed in claim 1, wherein each of the supporting pillars has an end surface; for the upper supporting pillar and the lower supporting pillar in contact with each other, the end surfaces thereof are abutted on each other.

7. The probe seat as claimed in claim 6, wherein the upper supporting pillar and the lower supporting pillar in contact with each other are further fixed to each other by gluing.

8. The probe seat as claimed in claim 6, wherein the upper supporting pillar and the lower supporting pillar in contact with each other are further fastened to each other by a bolt.

9. The probe seat as claimed in claim 6, wherein for the upper supporting pillar and the lower supporting pillar in contact with each other, one of them comprises a protrusion located on the end surface and the other comprises a recess located on the end surface; the protrusion is embedded in the recess.

10. The probe seat as claimed in claim 1, wherein the lower surface of the upper die unit and the upper surface of the lower die unit are each defined as a supported surface; the supporting pillars further comprise at least one individual supporting pillar; the individual supporting pillar is inserted through one of the upper die unit and the lower die unit and abutted on the supported surface of the other of the upper die unit and the lower die unit.

11. The probe seat as claimed in claim 1, wherein each of the supporting pillars has an end surface; the end surfaces of the upper supporting pillars are flush with the connecting surface of the upper die unit; the end surfaces of the lower supporting pillars are flush with the connecting surface of the lower die unit.

12. The probe seat as claimed in claim 1, wherein the lower surface of the upper die unit and the upper surface of the lower die unit are each defined as a supported surface; the supporting structure further comprises a plurality of connecting ribs; each of the connecting ribs is connected to two adjacent said supporting pillars and the supported surface on which the two adjacent supporting pillars are located.

13. The probe seat as claimed in claim 1, wherein at least one of the two die units comprises two dies; each of the dies comprises a joining surface; the joining surfaces of the two dies are connected with each other; for the joining surfaces of the two dies, one of them comprises a plurality of protrusions and the other comprises a plurality of recesses; the protrusions are embedded in the recesses, respectively.

14. The probe seat as claimed in claim 1, wherein the probe seat comprises a plurality of probe zones and a plurality of non-probe zones, which are distributed in a staggered manner; the probe zones and the non-probe zones are collectively arranged in a matrix; the upper through holes and the lower through holes are located in the probe zones; the supporting pillars are located in the non-probe zones.

15. The probe seat as claimed in claim 1, wherein the probe seat comprises a plurality of non-probe zones and a probe zone; the non-probe zones are arranged in a matrix; the probe zone is distributed in a grid pattern on a periphery of the non-probe zones and between the non-probe zones; the upper through holes and the lower through holes are located in the probe zone; the supporting pillars are located in the non-probe zones.

16. A probe head for performing a functional test to a device under test, the probe head comprising:

the probe seat as claimed in claim 1; and a plurality of probes inserted through the probe seat.

17. A probe card for performing a functional test to a device under test, the probe card comprising:

an interface board arranged to interface with a test apparatus;

a space transformer associated with the interface board and adapted for providing space transformation in interval between contact pads formed on two opposite surfaces of the space transformer; and the probe head as claimed in claim 16, which is associated with the space transformer.

18. A probe system for performing a functional test to a device under test formed on a substrate, the probe system comprising:

a chuck arranged for supporting the substrate;

a test apparatus adapted to be electrically connected with the device under test so as to create an electrical property testing process; and the probe card as claimed in claim 17 for electrically connecting the device under test with the test apparatus so as to perform the functional test to the device under test.

19. A probe seat comprising:

two die units comprising:

an upper die unit comprising an upper surface, a lower surface, and a plurality of upper through holes penetrating through the upper surface and the lower surface of the upper die unit; and a lower die unit comprising an upper surface, a lower surface, and a plurality of lower through holes penetrating through the upper surface and the lower surface of the lower die unit;

a supporting structure comprising a plurality of supporting pillars, the supporting pillars being disposed between the upper die unit and the lower die unit, and an accommodating space formed around the supporting pillars and between the upper die unit and the lower die unit, the accommodating space being adapted for a plurality of probes to be inserted through the upper through holes, the accommodating space, and the lower through holes, respectively;

wherein the supporting pillars comprise a plurality of upper supporting pillars and a plurality of lower supporting pillars, the upper supporting pillars protrude out of the lower surface of the upper die unit; the lower supporting pillars protrude out of the upper surface of the lower die unit, the upper supporting pillars are in contact with the lower supporting pillars, respectively;

wherein each of the supporting pillars has an end surface; for the upper supporting pillar and the lower supporting pillar in contact with each other, the end surfaces thereof are abutted on each other;

wherein the upper supporting pillar and the lower supporting pillar in contact with each other are further fastened to each other by a bolt;

wherein a distance between the end surface of the upper supporting pillar and the lower surface of the upper die unit is smaller than a distance between the end surface of the lower supporting pillar and the upper surface of the lower die unit; the bolt is inserted through the upper supporting pillar and screwed into the lower supporting pillar.

20. A probe seat comprising:

two die units comprising:

an upper die unit comprising an upper surface, a lower surface, and a plurality of upper through holes penetrating through the upper surface and the lower surface of the upper die unit; and a lower die unit comprising an upper surface, a lower surface, and a plurality of lower through holes penetrating through the upper surface and the lower surface of the lower die unit;

a supporting structure comprising a plurality of supporting pillars, the supporting pillars being disposed between the upper die unit and the lower die unit; and an accommodating space formed around the supporting pillars and between the upper die unit and the lower die unit, the accommodating space being adapted for a plurality of probes to be inserted through the upper through holes, the accommodating space, and the lower through holes, respectively, wherein the supporting pillars comprise a plurality of upper supporting pillars and a plurality of lower supporting pillars; the upper supporting pillars protrude out of the lower surface of the upper die unit; the lower supporting pillars protrude out of the upper surface of the lower die unit, the upper supporting pillars are in contact with the lower supporting pillars, respectively;

wherein the lower surface of the upper die unit and the upper surface of the lower die unit are each defined as a supported surface; the supporting pillars further comprise at least one individual supporting pillar; the individual supporting pillar is inserted through one of the upper die unit and the lower die unit and abutted on the supported surface of the other of the upper die unit and the lower die unit;

wherein the individual supporting pillar comprises an extending section protruding out of one of the upper surface of the upper die unit and the lower surface of the lower die unit; the extending section is adapted to be abutted against a reinforcing member.

* * * * *